United States Patent [19]

Sokal et al.

[11] 3,900,823

[45] Aug. 19, 1975

[54] AMPLIFYING AND PROCESSING APPARATUS FOR MODULATED CARRIER SIGNALS

[76] Inventors: Nathan O. Sokal; Alan D. Sokal, both of 4 Tyler Rd., Lexington, Mass. 02173

[22] Filed: Mar. 28, 1973

[21] Appl. No.: 345,509

[52] U.S. Cl. ............... 330/149; 330/129; 332/37 D

[51] Int. Cl. ............................................ H03y 3/00

[58] Field of Search .................... 330/149, 127–129; 332/18, 37 R, 37 D; 328/162, 163, 155; 325/475, 476

[56] References Cited

UNITED STATES PATENTS

| | | | |
|---|---|---|---|
| 2,298,930 | 10/1942 | Decino | 332/18 X |
| 2,705,775 | 4/1955 | Crosby | 332/37 R X |
| 2,708,717 | 5/1955 | Holmes et al. | 328/162 X |
| 3,241,077 | 3/1966 | Smyth et al. | 328/155 X |
| 3,274,492 | 9/1966 | Van Kesser et al. | 332/37 R X |
| 3,486,128 | 12/1969 | Lohrmann | 332/37 R X |

*Primary Examiner*—James B. Mullins

*Attorney, Agent, or Firm*—Wolf, Greenfield & Sacks

[57] ABSTRACT

A power amplifying and signal processing system for modulated carrier signals separately processes the amplitude component of the system input signal and the component of frequency or phase or both frequency and phase, and later recombines the separately processed components to provide an output signal. The amplitude and phase transfer functions of the system can be accurately controlled. The input signal is fed to a power amplifier whose output provides the output for the system. The input and output signals of the system are fed by separate paths to a comparator which compares those signals and emits an error signal to a controller. The controller regulates the amplitude and phase, or both, of the power amplifier's output to null the error signal. One or both of the signal paths to the comparator may have in it a non-linear function generator which acts upon the signal fed by that path to the comparator. The system may also have a frequency translator and phase shifter interposed between the system input terminal and the power amplifier's input to shift the frequency or phase or both of the signal applied to the power amplifier's input.

20 Claims, 24 Drawing Figures

AMPLIFYING AND PROCESSING APPARATUS FOR MODULATED CARRIER SIGNALS

TABLE OF CONTENTS

FIELD OF INVENTION
- LINEAR AMPLIFIER
- AMPLIFIER WITH OTHER THAN LINEAR AMPLITUDE TRANSFER FUNCTION AND/OR OTHER THAN CONSTANT TIME DELAY

OBJECTS OF THE INVENTION

BRIEF DESCRIPTION OF DRAWINGS

Figure 1:
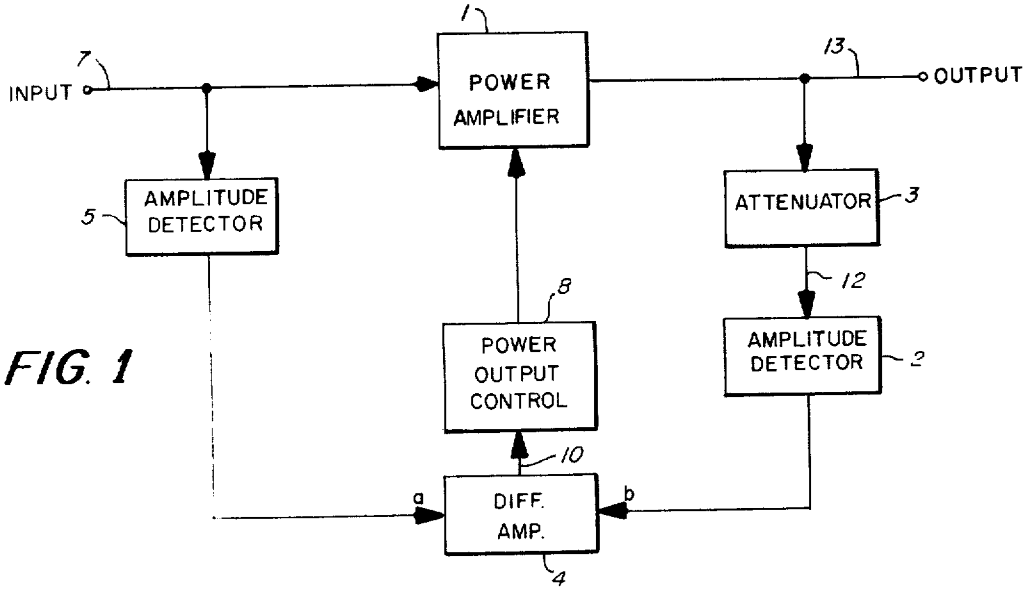

DETAILED DESCRIPTION OF THE INVENTION
- A. IMPROVED LINEAR AMPLIFIER
  - 1. Linear Amplitude Transfer Function, Input and Output Frequencies the Same
  - 2. Linear Amplitude Transfer Function, with Frequency Translation Between Input and Output
  - 3. Linear Phase Transfer Function
- B. AMPLIFIER WITH ARBITRARY TRANSFER FUNCTIONS
- C. SUPERIOR EMBODIMENTS OF THE LINEAR AMPLIFIER
- D. ALTERNATE FORM OF A SYSTEM WHICH INCLUDES FREQUENCY TRANSLATION INSIDE THE FEEDBACK LOOP
- E. EQUALITY OF PROPAGATION DELAY
- F. POWER OUTPUT CONTROL
  - 1. Control of DC Power Supply with Switching Regulator
  - 2. Control of DC Power Supply with Dissipative Direct-Coupled Regulator
  - 3. Control of DC Power Supply with AC-Coupled Modulator
  - 4. Control of DC Power Supply with Switching Regulator and AC-Coupled Modulator
  - 5. Control of RF Cycle Duty Ratio
  - 6. Combinations of the Above Methods
- G. MODIFICATIONS OF THE INVENTION

CLAIMS

FIELD OF INVENTION

The present invention relates in general to power amplifiers for modulated carrier signals which, for example, can be employed as radio-frequency power amplifiers for radio communications or phased-array directional transmitting systems, or ultrasonic-frequency power amplifiers for underwater communications or sonar transmitters. In its most general form, the invention relates to a signal processor as well as a power amplifier inasmuch as the invention can be embodied in apparatus having accurately-controlled but arbitrary amplitude and phase transfer functions. Sometimes such controlled functions are referred to as "shaped gain characteristics" and "shaped phase characteristics".

An amplifier embodying the invention can provide power efficiency together with accuracy of the amplitude and phase transfer functions which are significantly improved over those of prior-art power amplifiers. In particular, the invention permits both high efficiency (approaching 100%) and high accuracy to be obtained simultaneously, whereas "prior art" power amplifiers require a compromise to be made between these two characteristics because an improvement in one is achieved only at a sacrifice in the other. The invention, in addition, permits the amplitude and phase transfer functions to be made dependent upon one or more external control signals. The invention can be embodied as a power amplifier that is particularly suited for high-efficiency linear amplification of the amplitude-modulated and single-sideband signals employed in radio communications. Other embodiments of the invention can be constructed to be particularly useful as high-level high-efficiency high-accuracy amplitude modulators, phase modulators, and amplitude compressors.

Considering the frequency spectrum which results, the high accuracy which can be attained with the invention in amplitude and phase transfer functions is particularly advantageous in that it allows the output spectrum of the amplifier to have a greatly reduced spurious content as compared with prior-art amplifiers. That spurious output is undesirable for two reasons. First, the spurious output can interfere with other uses of the frequency band in which spurious components lie. For example, the spurious output can cause crosstalk among channels in a frequency-division-multiplexed system. As another example, the spurious output can cause interference in the sideband on the other side of the carrier frequency in a single-sideband system, thus comprising the utility of the single-sideband system in which one sideband is intentionally removed to allow that portion of the frequency spectrum to be available for other transmitters. Second, the spurious output can distort the signals being communicated, leading to a loss of accuracy in the received signals. Considered in the time domain rather than as a frequency spectrum, high accuracy in amplitude and phase transfer functions makes possible such results as accurate control of phased-array antenna beam shape and direction of transmission by rf signals (and, optionally, the time-varying control signals) applied to the plurality of power amplifiers which drive the plurality of antenna radiating elements.

The high efficiency attainable with the invention is especially desirable in applications where any of the following are important: low power consumption; low equipment temperature rise; high equipment reliability; small equipment size; low weight. Because of that high efficiency, only a small amount of power is wasted in the form of heat, whereby the requirement to dissipate heat by heat-transfer means such as heat sinks or air-blowers is substantially reduced.

LINEAR AMPLIFIER

The ideal linear amplifier reproduces at its output the exact form of the input signals. Regardless of the type of modulation employed in the input signal (single-sideband, amplitude modulation, phase mdulation, etc.), a carrier which has been modulated can be considered to be, at any instant of time, a carrier wave characterized by a frequency, an amplitude, and a phase with respect to a reference such as the unmodulated signal of the carrier-frequency oscillator. The instantaneous values of frequency, amplitude, and phase of the modulated signal change as time proceeds. If the frequency, amplitude, and phase are reproduced accurately at the amplifier's output, then the amplifier has reproduced the input wave substantially without distortion. The reproduced wave is considered to be undistorted in the usual sense if the amplifier output is equal to the amplifier input multiplied by a constant factor (the gain of the amplifier) or if that output is delayed by a constant time (the propagation delay). The gain of the amplifier can be positive or negative (a phase inversion) and its magnitude can be larger or smaller than unity depending on the source and load impedances and the power gain. A constant time delay can also be considered to be a phase lag which is proportional to frequency.

A switching-type power amplifier (e.g. Class D, Class S or Class C driven to full output) can be more efficient than conventional linear amplifiers of the Class A, AB, and B types. However, because the output amplitude of the switching-type amplifier is fixed by the voltage of the power supply, switching-type amplifiers have generally been deemed suitable only for applications such as cw or fm, where the output signal is of constant amplitude when the amplifier is delivering output power. The frequency and phase components of a modulated wave are substantially preserved by a switching amplifier if the amplifier is driven by an input obtained from a hard limiter which slices the input signal within a small amplitude interval centered on the zero axis. The present invention permits any residual phase distortion in the switching amplifier (e.g. that resulting from nonlinear impedances) to be substantially eliminated by introducing into the amplifier a controlled phase shift which compensates for the phase distortion. Negative feedback may advantageously be used in this regard. The present invention further causes the amplitude component of the modulated wave to be preserved by controlling the rf power output of the final stage of the switching amplifier in a manner such that the amplitude of the output rf signal is proportional to the amplitude of the input rf signal. This control can be effected in numerous ways, the simplest of which is to control the dc power supply voltage for the final stage of the switching amplifier. Although switching of the amplifier causes considerable distortion of the individual rf cycles of the input signal, the amplitude of the output rf signal is not distorted where the rf power output of the switching amplifier is properly controlled. The distortion of individual rf cycles produces rf harmonics and, in some cases, baseband modulation frequencies, but these can be readily eliminated by conventional low-pass or band-pass filtering, respectively, of the output, inasmuch as these harmonics and baseband frequencies generally do not extend into the frequency spectrum of the modulated carrier signal.

AMPLIFIER WITH OTHER THAN LINEAR AMPLITUDE TRANSFER FUNCTION AND/OR OTHER THAN CONSTANT TIME DELAY

With the invention, the rf power output of the switching amplifier can be controlled to cause the output amplitude to be any desired function of the input amplitude. For example, accurate amplitude compression can be obtained by arranging the apparatus to provide the desired nonlinear amplitude transfer function. Likewise, phase control apparatus may be provided to cause the output phase to be a desired function of the input phase. The amplitude and phase transfer functions may also be made dependent upon one or more external control signals, thereby converting the apparatus into a signal processor as well as a high-efficiency amplifier. The dependencies on the input signal and the external control signal(s) can be linear or nonlinear, as desired.

OBJECTS OF THE INVENTION

The principal object of the present invention is to provide a high efficiency power amplifier, phase modulator, or amplitude modulator capable of providing any desired amplitude and phase transfer functions to a high degree of accuracy.

A further object of the present invention is to provide a linear power amplifier which is particularly suited for the amplification of amplitude-modulated and single-sideband signals and which has increased efficiency and decreased distortion as compared with prior-art power amplifiers.

BRIEF DESCRIPTION OF DRAWINGS

FIG. 1 shows the scheme of a rudimentary embodiment of the invention.

Figure 2:
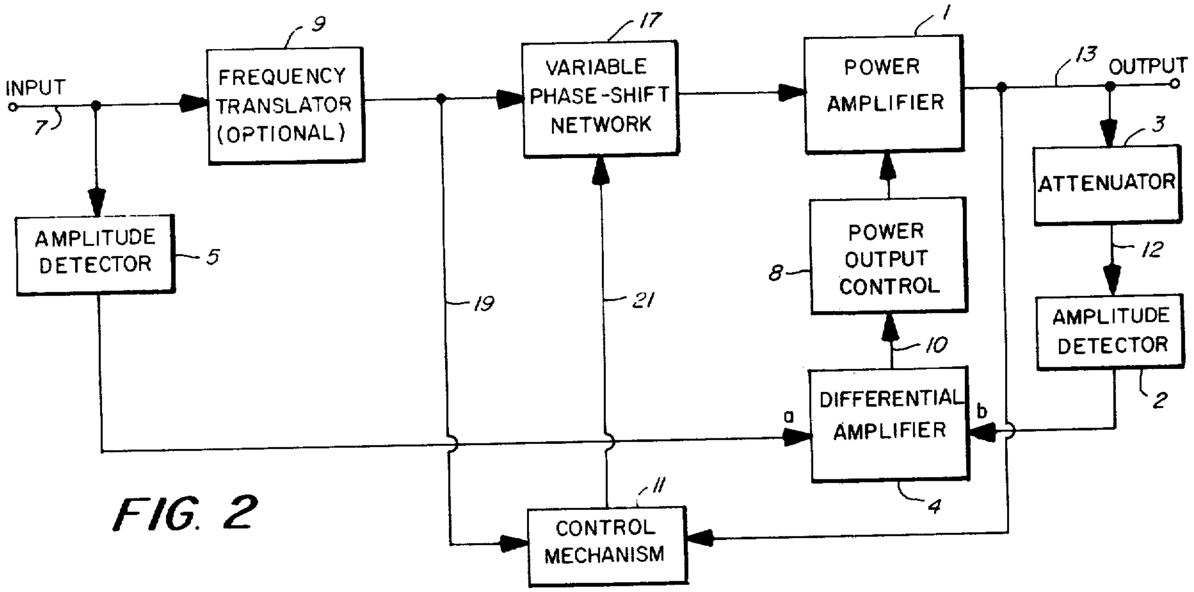

FIG. 2 depicts an embodiment of the invention.

Figure 3:
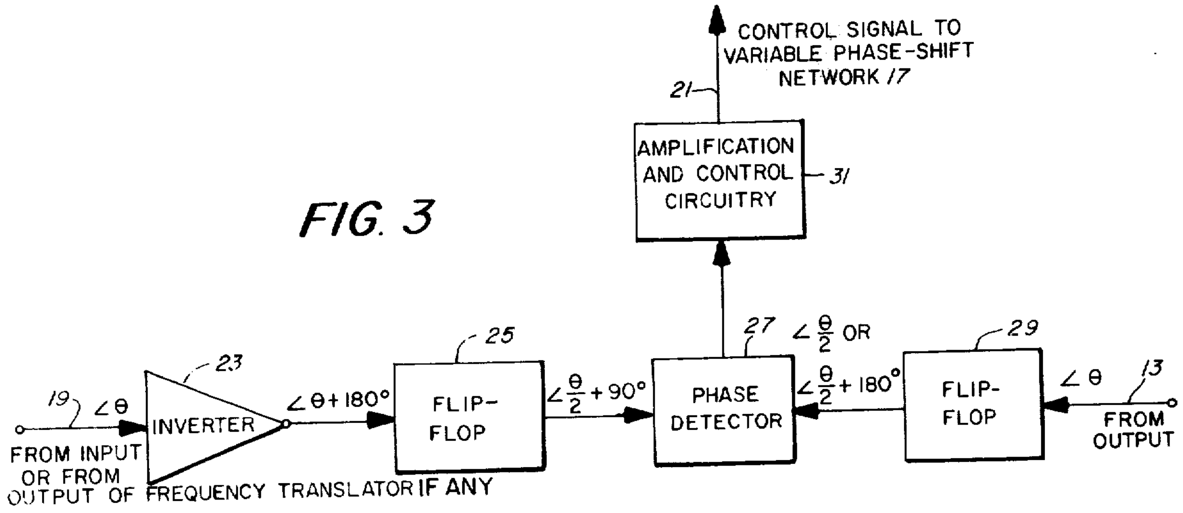

FIG. 3 schematically depicts a mechanism suitable for employment in the FIG. 2 embodiment.

Figure 4:
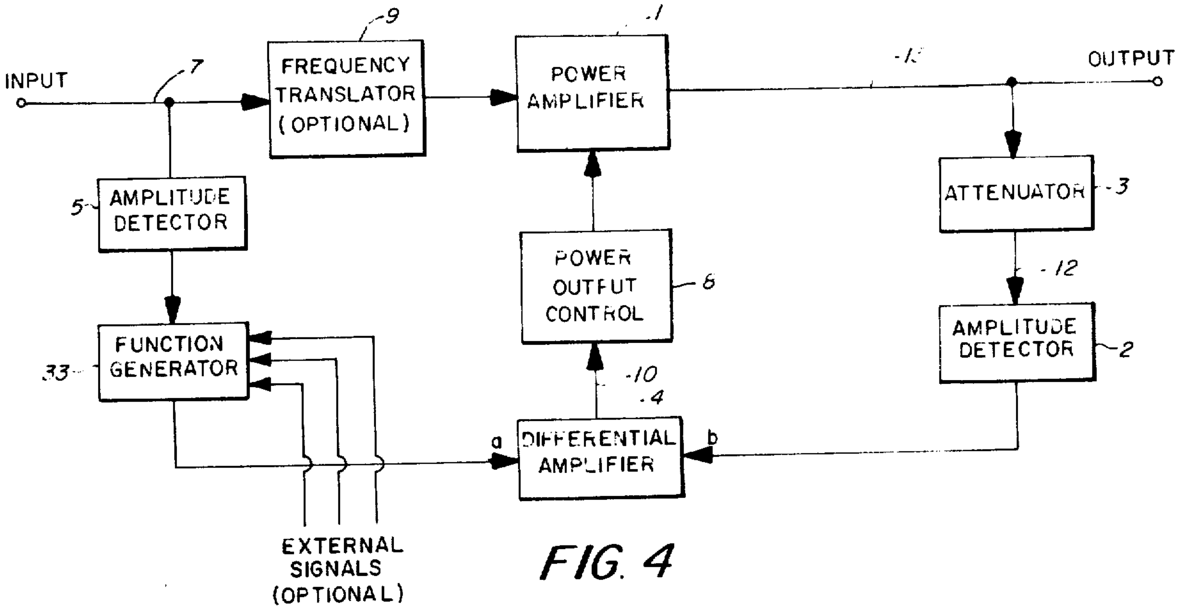

FIG. 4 shows an embodiment of the invention which permits its use as a signal processor in addition to its use as a power amplifier.

Figure 5:
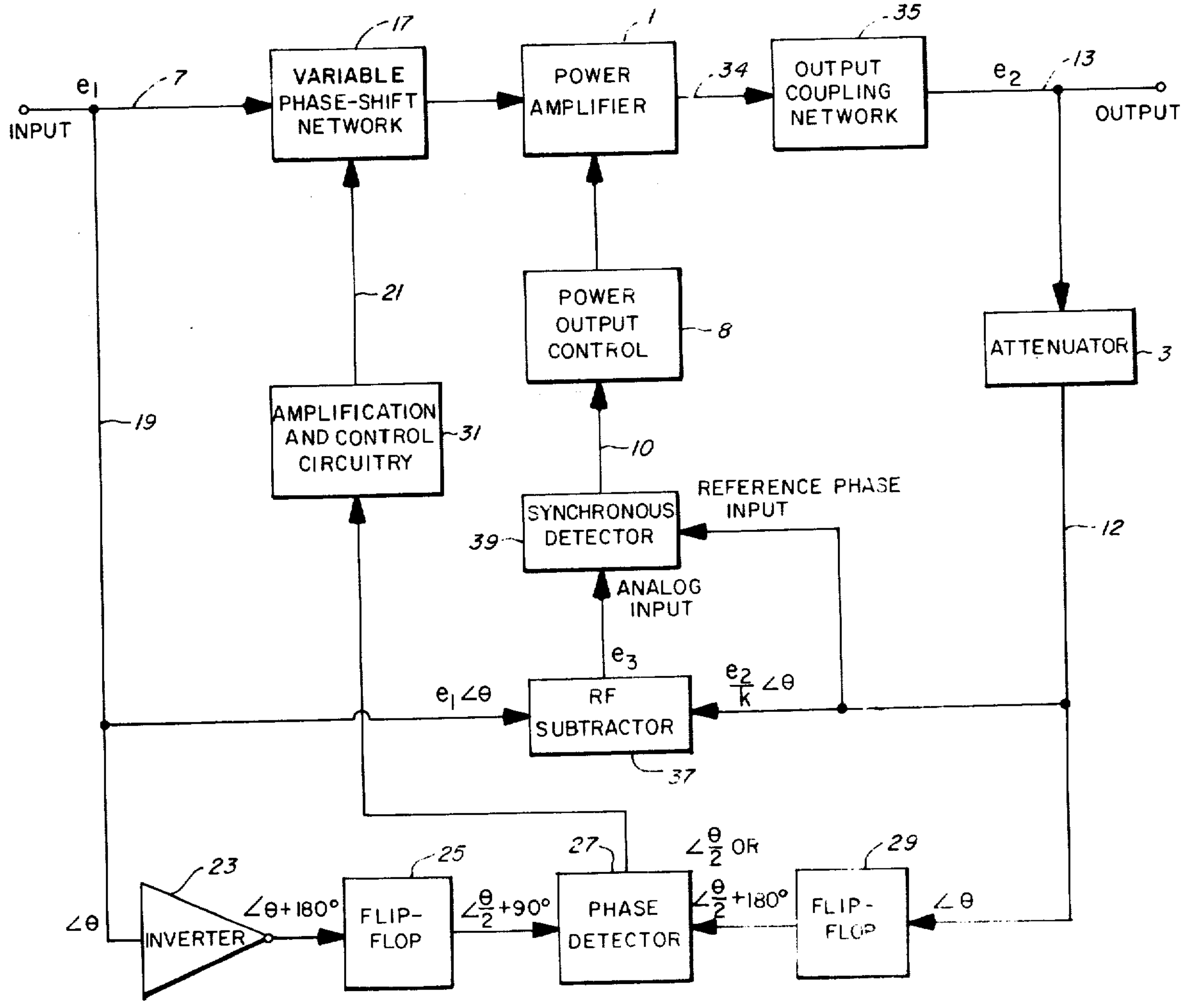

FIG. 5 schematically depicts the invention embodied in a linear amplifier.

Figure 6:
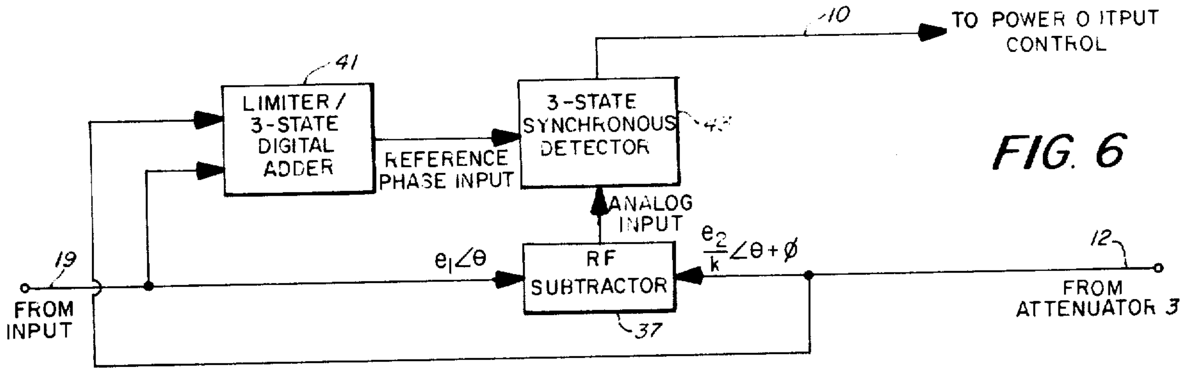
Figure 7:
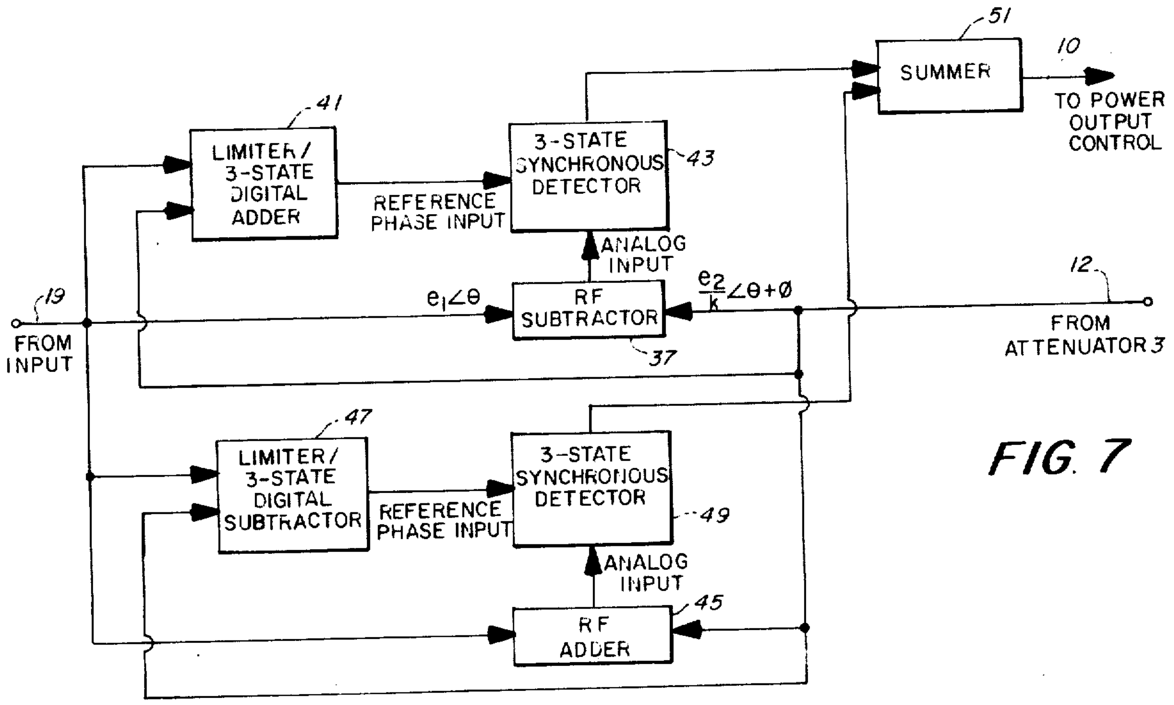

FIG. 6 is a block diagram of a circuit involved in the evolution of the circuit of FIG. 7.

FIG. 7 is a block diagram of a portion of the preferred linear amplifier of the invention.

Figure 8:
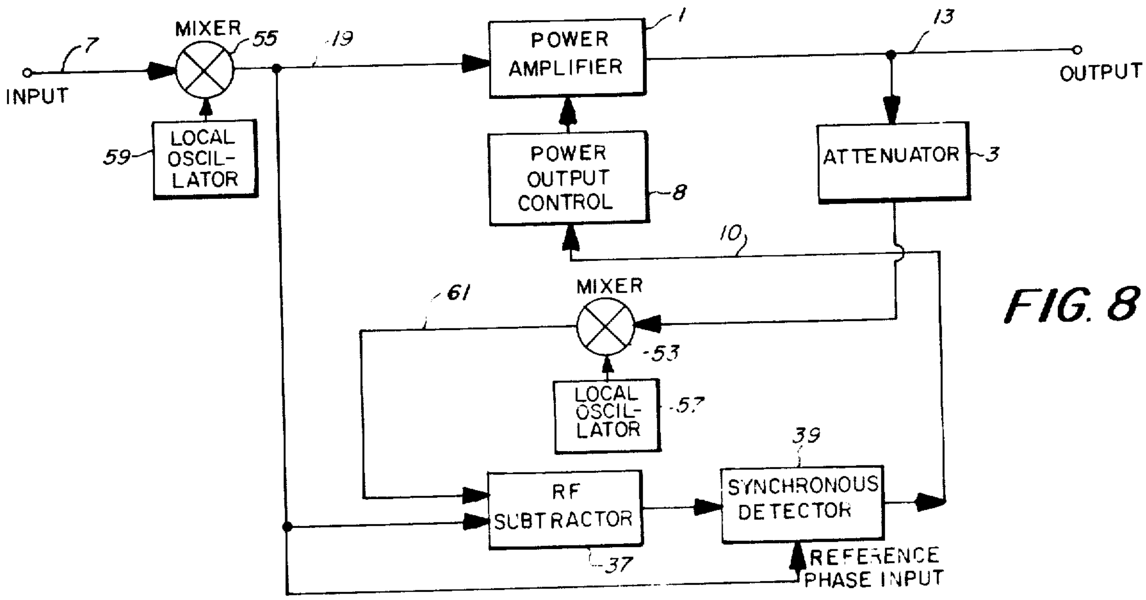

FIG. 8 depicts the scheme of the invention as embodied in a power amplifier which maintains an accurate amplitude transfer function while providing frequency translation of the input signal.

Figure 9A:
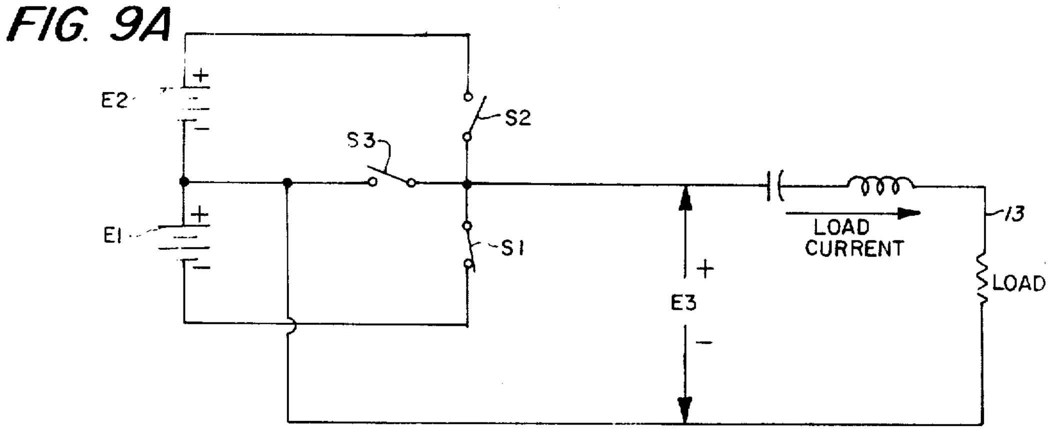
Figure 9B:
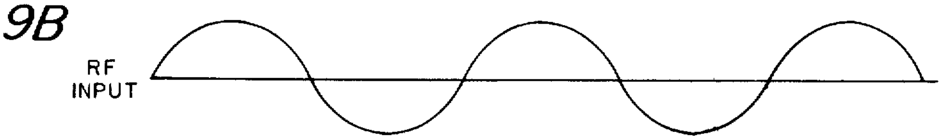
Figure 9C:
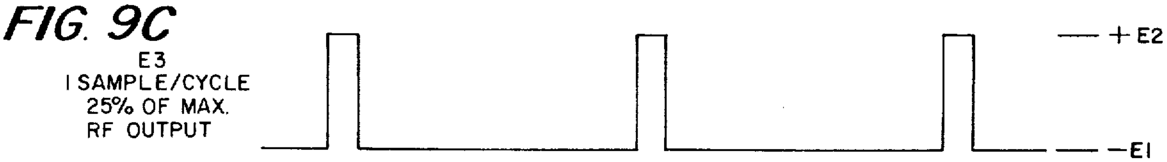
Figure 9D:
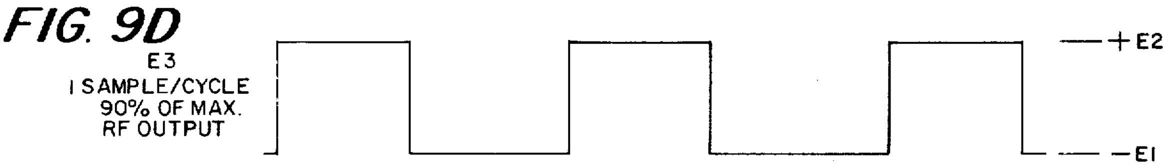
Figure 9E:
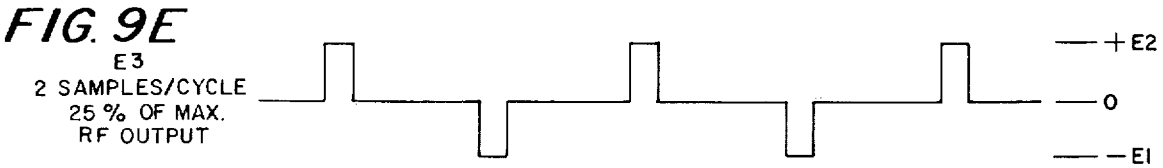
Figure 9F:
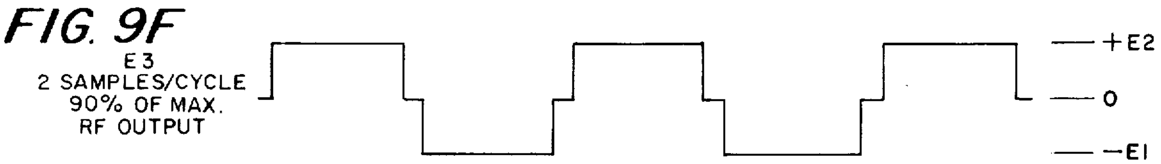

FIG. 9A is a circuit diagram of one embodiment of the power output control means of the invention, and FIGS. 9B thru 9F depict the associated waveforms.

FIGS. 10A through 10F depict waveforms occurring in the generation of the pulse-width modulated signal used to drive the circuit of FIG. 9A.

Figure 11A:
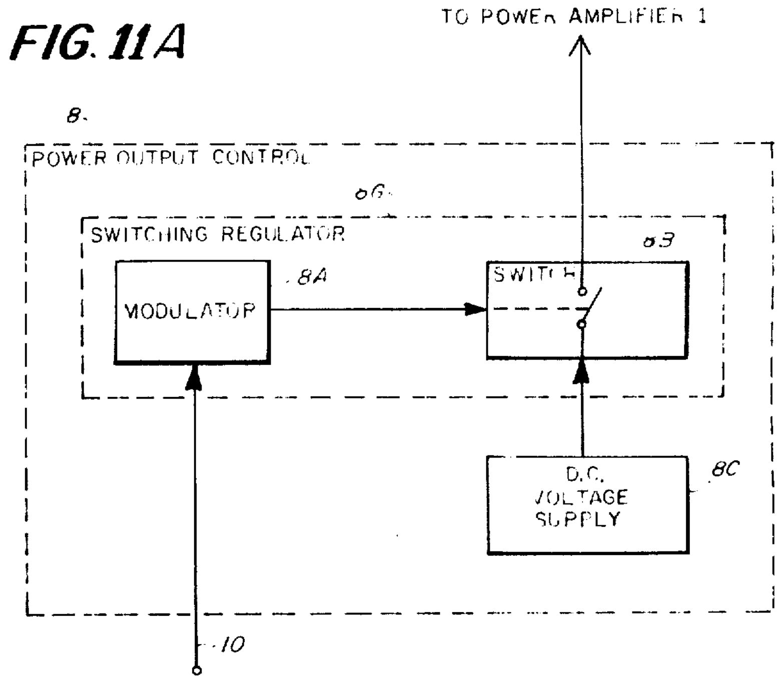

FIG. 11A depicts, in block diagrammatic form, the employment of a typical switching regulator in the power output control.

Figure 11B:
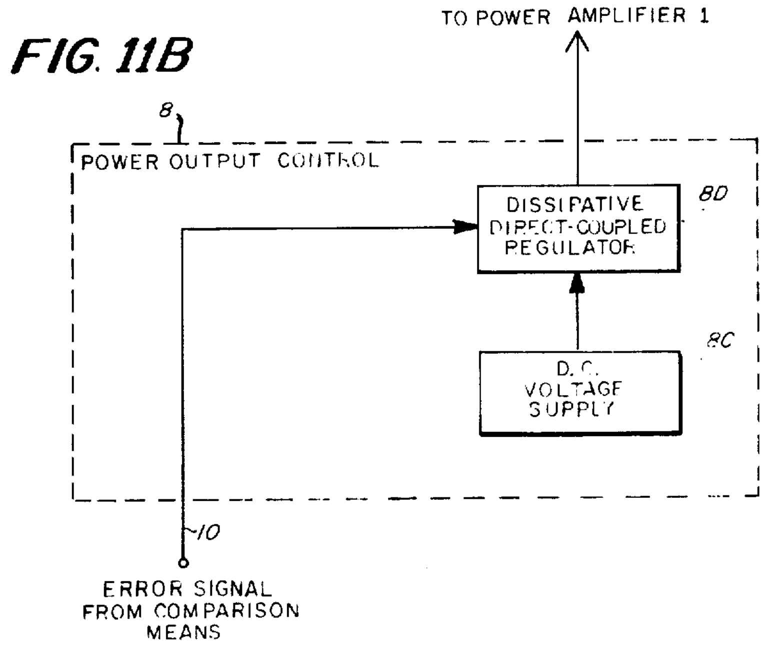

FIG. 11B schematically depicts the use of a dissipative direct-coupled regulator to control the dc power supplied to the power amplifier.

Figure 11C:
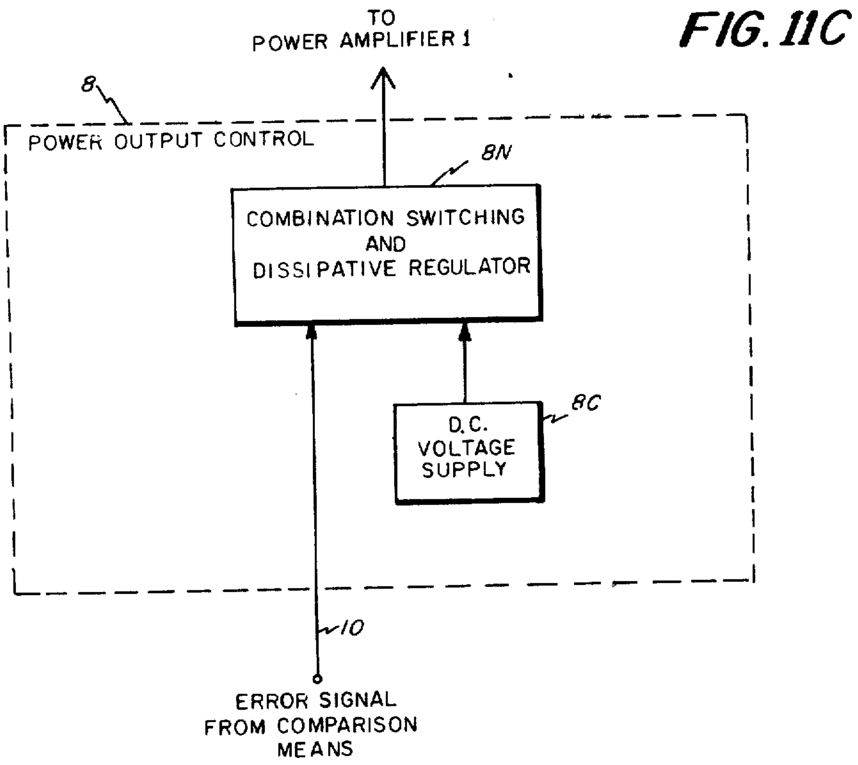

FIG. 11C illustrates the employment in the power output control of the combination of a switching regulator and a dissipative regulator to control the dc power supplied to the power amplifier.

Figure 11D:
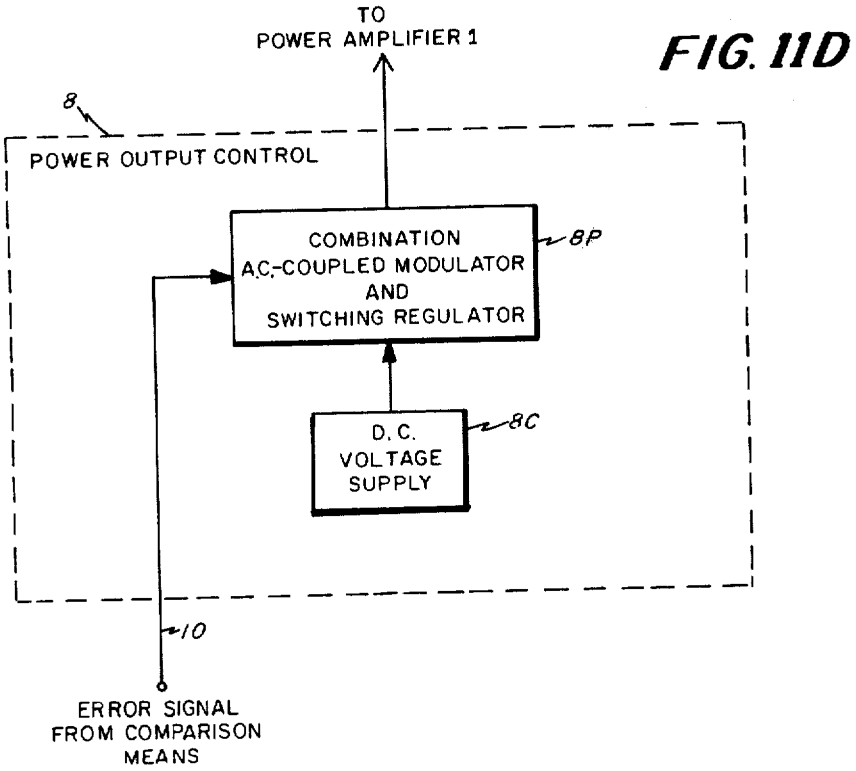

FIG. 11D illustrates, in schematic form, the employment in the power output control of the combination of an ac-coupled modulator and a switching regulator to control the dc power supplied to the power amplifier.

DETAILED DESCRIPTION OF THE INVENTION

A. Improved Linear Amplifier

1. Linear Amplitude Transfer Function, Input and Output Frequencies the Same A linear power amplifier constituting a rudimentary embodiment of the invention is illustrated in FIG. 1. A modulated rf (radio frequency) signal from a signal source (not shown) is applied via lead 7 to the input of an rf power amplifier 1. Power amplifier 1 may be subject to amplitude nonlinearity, and may in fact include an amplitude limiter or have an amplitude transfer function of the type generally associated with a limiter.

In particular, power amplifier 1 may be a switching-type amplifier, although this is not necessary to the proper functioning of the present invention. The output 13 of power amplifier 1 is coupled to an attenuator 3. The amplitude of the attenuated rf output signal emitted from the output 12 of the attenuator is detected by an amplitude detector 2. The output of the amplitude detector 2 is, in turn, applied to an input *b* of a differential amplifier 4. The differential amplifier 4 may be a conventional comparator which provides an output indicative of the difference between two input signals. The differential amplifier 4 may additionally include compensation networks of well-known character and function (e.g. lead-lag or amplitude limiter), for the purpose of improving the performance of the feedback loop of which the differential amplifier 4 comprises a part. The other input *a* of differential amplifier 4 is connected to the output of an amplitude detector 5 which detects the amplitude of the input signal impressed on terminal 7. The output 10 of differential amplifier 4 is employed by a power output control means 8 to vary the output amplitude of the rf power amplifier 1 in such a way as to cause it to be directly proportional to the amplitude of the input rf signal 7. The control means 8 may be implemented in numerous ways and several embodiments thereof are described later in this exposition. The sense of the inputs *a* and *b* relative to the output 10 of the differential amplifier is chosen according to the input-output control sense of control means 8 and power amplifier 1 such that an increase in amplitude of the signal at input *a* causes control means 8 to increase the signal at output 13 of the power amplifier 1.

The system as a whole constitutes a negative-feedback system operating on well-known principles. If the gain around the feedback loop ("open-loop gain") is large, the signals at inputs *a* and *b* of differential amplifier 4 are caused to be very nearly equal. The outputs of amplitude detectors 2 and 5 are therefore very nearly equal. If the transfer characteristics of amplitude detectors 2 and 5 are matched, there is a corresponding near-equality of amplitude of rf signals 7 and 12. As the amplitude of the rf output signal 13 is merely a constant multiple of the amplitude of the rf signal 12 (assuming the attenuator 13 is linear), output signal 13 is then very nearly proportional to the input signal 7, and the amplifier system is very nearly linear.

Attenuator 3 can be any of many well-known types. The requirements for the desired linear performance are (1) the attenuator should have a linear transfer function, i.e. H(s) of the attenuator, as operating between its source and its load, should be independent of the magnitude and phase of the signal applied to the attenuator input, and (2) the transfer function of the attenuator should be the inverse of what is desired for the entire system. Attenuator 3 may optionally be variable for purposes of gain adjustment. Because it usually is desired that the output voltage of the system be larger than the input voltage, attenuator 3 will usually have a voltage attenuation from input to output. In some circumstances, as where the load being driven by the amplifier is of low impedance, it may be desired to have the system output voltage not larger than the system input voltage. In such circumstances, attenuator 3 may in fact be designed to have an output voltage equal to or larger than its input voltage. The most common type of device used for the attenuator 3 is a resistive attenuator connected across the system output port. Other embodiments of attenuator 3 are discussed below.

A modification of the FIG. 1 arrangement can be made by interchanging the positions of attenuator 3 and amplitude detector 2. The modified arrangement may at first be thought to be completely equivalent to that of FIG. 1; it is in fact usable but greatly inferior to the FIG. 1 scheme. In the modified system, the signals at inputs *a* and *b* of differential amplifier 4 are very nearly equal to the signal at the output of amplitude detector 5 multiplied by a constant factor (viz. the attenuation of attenuator 3). Ideally, the linear relation between the outputs of amplitude detectors 2 and 5 is accompanied by a corresponding linear relation between their inputs, viz. the output at 13 and the input at 7 of the linear amplifier system. In an ideal realization of the modified system, the transfer characteristics of amplitude detectors 2 and 5 are both perfectly linear and free of offset, and the aforesaid linear relation between the output and input rf amplitudes obtains. In practice, however, amplitude detectors 2 and 5 are not perfectly linear nor offset-free, although those detectors may be nearly identical. In the modified system, amplitude detector 2 operates at a different signal level from detector 5, due to the attenuation introduced by attenuator 3 to obtain near-equality of the signals at *a* and *b*. Because the two detectors operate at different signal levels, the transfer characteristic of the signal path from input terminal 7 to input *a* is not necessarily matched to that of the path from output 13 to input *b* even if the two detectors are identical, if those detectors are not perfectly linear and offset-free. The circuit designer employing the modified system, therefore, attempts to provide amplitude detectors with highly linear and offset-free transfer characteristics. Insofar as the nonlinearity and offset of the two detectors can be made to approach zero, the modified system can be made to approach distortion-free operation. However, nonlinearities and offsets in the transfer characteristics of detectors 2 and 5 always occur in practice inasmuch as ideal detectors are not realizable in actuality.

The system of FIG. 1 is less subject to distortion from the above causes, because the amplitude detectors 2 and 5 are made to operate at the same signal level. In this arrangement, the transfer characteristics of the two detectors 2 and 5 need only be monotonic and matched in order to eliminate the above distortion; they need neither be linear nor free of offset. Identical nonlinearities and offsets in the two detectors do not significantly degrade the linearity of the full system; they only cause the system open-loop gain to vary somewhat with signal amplitude.

Other embodiments of attenuator 3 are applicable in various circumstances. Attenuator 3 can operate with voltage or current input and with voltage or current output, dependent on the types of circuits used for feeding its input and for using its output signal. Voltage input refers to an attenuator whose input impedance is high compared with its source. Current input refers to an attenuator whose input impedance is low compared with its source. Voltage output refers to an attenuator whose output impedance is low compared to the impedance of its load whereas current output refers to an attenuator whose output impedance is high compared to its load impedance. A resistive attenuator is the type of device most commonly used for attenuataor 3 and is usually designed for voltage input and voltage output.

Attenuator 3 can also be, for example, an inductive pickoff coupled to the magnetic field in the vicinity of the load (e.g. the antenna) or the load-current-carrying conductor(s) feeding the system output port or connecting that port to the load (e.g. the transmission line between the amplifier output and the load). Attenuator 3 can also be a capacitive pickoff coupled to the electric field in the vicinity of the load or the system output port. It could also be a step-down (or step-up) transformer or autotransformer connected across the system output port, or a capacitive or inductive voltage divider there, etc.

More elaborate versions of attenuator 3 can use combinations of resistive, capacitive and inductive coupling to the output 13, to the load, or to one or more of the load-current-carrying conductors. For example, capacitive and inductive couplings can be combined so as to sense separately the "forward" ("incident") signal and the "reverse" ("reflected") signal in a system which has a load which is not purely resistive, i.e. a standing wave ratio (SWR) greater than 1.0. Such a circuit is shown, for example, as a SWR monitor in *The A.R.R.L. Antenna Book*, 8th Edition, pages 132–134, published by American Radio Relay League, Newington, Conn. The circuit shown there includes, additionally, diode detectors which rectify the carrier-frequency signals to detect their amplitudes for presentation on a dc meter. Taking the difference between the forward and reverse signal magnitudes yields the component of the signal in which the voltage and current are in-phase with each other, i.e. that component which results in power being delivered to the load, as distinguished from stored energy being exchanged periodically between electric and magnetic fields.

In general, attenuator 3 can include resistive, capacitive and inductive couplings to the power amplifier output 13 or its load or the load-current-carrying conductors between them. Additionally, the attenuator can include provisions for sensing the phase difference between voltages and currents at the output or load or in the conductors, and for combining the resulting signals in various ways to sense voltage, current, in-phase components, quadrature-phase components, and functions thereof.

For the case of an amplifier which delivers mechanical power to its load via an electromechanical transducer (e.g. to excite acoustic waves in water for sonar or underwater communication applications), the pressure, velocity, or displacement or functions thereof, of the medium (the water, in this example) can be sensed by an appropriate sensor, instead of sensing an electric or magnetic field. This sensor converts the sensed mechanical quantities to an electrical signal which is fed to the input of attenuator 3. Similarly, other applications can involve conversion of the amplifier output power to light (e.g. in an optical communication system), heat (e.g. in an rf induction heater system), or other forms of output. Appropriate sensors are then employed to sense and process those outputs and provide electrical signals for the attenuator 3. The system inherently acts to reduce the effects of nonlinearities introduced by the electromechanical, electroptic or electrothermal energy conversions from the amplifier output to the load inasmuch as the system provides high linearity between the input 7 and the output 12 of attenuator 3. In view of the various forms which the output of power amplifier 1 may take, it is intended that the block labeled attenuator 3 shall include apparatus which senses the output of the power amplifier in whatever form it may take and provides appropriate electrical signals at the output of the attenuator.

The linearity of the entire system transfer function is governed directly by the linearity of the attenuator 3 transfer function. Therefore the components chosen for use in the attenuator should be sufficiently linear to assure the desired overall system linearity. For example, appreciable nonlinearity can be found in some ceramic capacitors, some inductors with ferromagnetic cores, and some carbon composition or screened thick-film resistors. In addition, the inductance, capacitance and resistance values of these attenuator components can change during the modulation of the power output of power amplifier 1. This can occur because the C, L and R values can be functions of the component temperature. The component temperatures can vary in response to the varying power dissipation in the components, resulting from the modulation-caused variation in power output of power amplifier 1.

Similarly, certain types of components generate more electrical noise than others; such excessive noise, when present, causes spurious noise modulation of the system output signal via the feedback control system. Inadequate shielding of the attenuator 3 from sources of interfering signals may allow such interfering signals to be picked up by attenuator 3. The introduction of such signals into the feedback control loop could likewise cause spurious modulation of the system output signal.

Having been informed of these potential sources of distortion, the engineer skilled in the art can design the attenuator 3 to be sufficiently free of distortion, noise, and pickup of interfering signals for the purposes of his equipment design.

2. Linear Amplitude Transfer Function, with Frequency Translation between Input and Output It is common for amplitude-modulated signals to be generated at a frequency other than the output frequency and later be heterodyned to the output frequency. The initially generated signal is often fixed in frequency while the output frequency is variable, e.g. in a tunable single-sideband transmitter employing a fixed-frequency crystal filter in the modulator. Such frequency translation involves the use of one or more mixers, filters, and buffer amplifiers, any or all of which may have nonlinear transfer characteristics, resulting in distortion. Where the system of FIG. 1 is employed, all frequency translation must be made in the input signal prior to applying that signal at terminal 7. That system may be modified to provide for frequency translation within the system by utilizing the scheme depicted in FIG. 2 where a frequency translator 9 is interposed between input terminal 7 and rf power amplifier 1, and the input of amplitude detector 5 is fed from the output of the modulator (now shown) or from a subsequent point in the signal path. Any amplitude distortion due to nonlinearity in the frequency translator is now reduced by the feedback action of the system. Amplitude detectors 2 and 5 are designed so that their amplitude transfer characteristics are well matched when the detectors operate at different rf frequencies, as is the case here.

3. Linear Phase Transfer Function

Spurious phase modulation is sometimes a significant source of distortion in linear amplifiers. This phase distortion may result, for example, from nonlinear loading of tuned circuits (e.g. by a transistor or vacuum-tube input impedance) or from nonlinear reactances (e.g. reverse-biased semiconductor junctions or partially-saturated inductors). Just as the system of FIG. 1 employs feedback to reduce amplitude distortion, feedback can be employed to reduce phase distortion. In the system of FIG. 2 this is accomplished by the control mechanism 11 which is arranged to control a variable phase-shift network 17 so as to cause the phase of the signal at the output 13 of the system to be equal to the phase of the signal at lead 19 (plus perhaps a constant phase shift).

An implementation of the control mechanism 11 is schematically illustrated in FIG. 3. In that scheme, the output of frequency translator 9, assumed to be of phase $\theta$, is applied over lead 19 to the input of an inverter 23, which shifts the phase of the signal 180°. The output of inverter 23 ($\theta + 180°$) is applied to the input of flip-flop 25, the output thereof being a signal of half the input frequency, and of phase $\theta/2 + 90°$. The output 13 of power amplifier 1 is applied to a flip-flop 29 whose output signal likewise is half the frequency and phase of its input signal. A phase detector 27 to which the outputs of the flip-flops are applied as inputs emits an output signal approximately proportional to the cosine of the phase difference between the two input signals. The output of the phase detector is amplified by amplification and control circuitry 31 and applied via lead 21 to control the phase shift of network 17. The amplification and control circuitry 31 may optionally include compensation networks of well-known character and function (e.g. lead-lag or amplitude limiter), for the purpose of improving the performance of the feedback loop in which the amplification and control circuitry 31 is situated. In accordance with the principles of high-gain negative feedback systems, the output of phase detector 27 is approximately zero and the phase difference between its two inputs is ±90°. The output of flip-flop 29 must therefore be of phase $\theta/2$ or ($\theta/2 + 180°$); this is the case only if the signal at lead 13 (i.e. the output of power amplifier 1) is of phase $\theta$ or $\theta + n$ 360°, where $n$ is an integer. The arrangements depicted in FIGS. 2 and 3 act, therefore, to cancel any phase distortion within power amplifier 1 by maintaining substantially zero phase shift between input and output of the entire amplifier system.

The phase control apparatus of FIG. 2 and 3 is not perfectly distortionless, even in theory. In a distortionless amplifier, the phase of the output signal is equal to the phase of the input signal plus perhaps a constant time delay (the propagation delay). A constant time delay can also be considered as a phase shift which is portional to frequency. The phase-control scheme here described acts to keep the output phase always equal to the input phase plus a fixed integer multiple of 360°. Unless this integer is made zero (which may be done, for example, by inserting a properly-adjusted delay element in path 19 in FIG. 4), the result is not the exact equivalent of the purely distortionless case of a constant time delay. If the rf input signal is of a type (e.g. conventional fm, or two-tone ssb, but not conventional full-carrier am) whose instantaneous frequency varies with time, the effective propagation delay of the above amplifier system will vary accordingly, producing phase distortion. Such phase distortion is small if the variation in instantaneous frequency of the rf input signal is small compared with the carrier frequency itself, and if the rate of such variation is also small compared with the carrier frequency. Such conditions are easily fulfilled in most practical radio-frequency applications of the present invention. In most applications, therefore, the distortion inherently introduced by the phase control apparatus of FIG. 2 and 3 is much smaller than the amplifier distortion which that phase control apparatus serves to eliminate.

In the system of FIG. 2, the amplitude control and phase control subsystems are entirely independent, and either subsystem may be omitted without affecting the operation of the other. For example, amplitude control may be omitted where the input signal is of constant amplitude as in cw or fm; phase control may be omitted where phase distortion is known to be insignificant or irrelevant in a particular application.

B. Amplifier with Arbitrary Transfer Functions

The system of FIG. 1 may be modified in the manner schematically depicted in FIG. 4 to provide a power amplifier having any desired amplitude transfer function. In the FIG. 4 system, the output of amplitude detector 2 is compared not to the output of amplitude detector 5, but rather to the desired function of the output of amplitude detector 5, as provided by function generator 33. In this way the amplitude of the signal at output 13 is caused to be the desired function of the amplitude of the input signal applied at terminal 7.

The term "function generator" denotes any circuit or device whose output signal is a predetermined mathematical function of one or more input signals. Such a mathematical function may depend on time derivatives and/or time integrals of an input signal, as well as on instantaneous values thereof (e.g. the "function generator" may be a frequency-domain filter). The function may also, for example, be the identity function (in which case the function generator could consist merely of a direct connection), a linear function (in which case the function generator could be an attenuator or an amplifier), the exponential function, or the product function (in which case there would be two or more input signals), or a combination of such functions.

The function generator 33 shown in FIG. 4 is in the path of the input signal, but it may be convenient to place the function generator in the path of the output signal (e.g. following amplitude detector 2). In this latter arrangement, the function required from the function generator is the inverse of the desired system amplitude transfer function. For some system transfer functions, this placement of the function generator in the path of the output signal permits the use of a more-easily-realized function generator (e.g. the function "square" is more easily realized with presently available components than the function "square root"). Where the function generator is placed in the output signal path, the function should be monotonic nondecreasing to insure that the system operate at all times in the negative-feedback mode. With a nonlinear function generator in the output signal path, the open-loop system gain will vary as a function of amplitude, which may in some cases be a disadvantage.

The most general system is realized by employing a function generator $f$ in the input path and a function generator $g$ in the output path. The amplitude transfer function of this system is $g^{-1} o f$, where $g^{-1}$ is the inverse function of $g$ and $o$ represents the mathematical composition of functions. It is to be noted that the systems of FIGS. 1 and 2 represent a special case of the above generalized system, viz. that in which the functions of $f$ and $g$ are both linear, and in which the function generators for $f$ and $g$ may indeed consist merely of a direct connection (i.e. providing the identity function).

In the signal processor scheme shown in FIG. 4, the attenuator 3 may precede the amplitude detector 2, as shown, or may follow that detector. In the latter case, the attenuator may be considered to be part of the function generator $g$, i.e. providing a linear function in cascade with a generator of function $g$. Alternatively, a desired nonlinearity or a controllability by an external control signal can be built into attenuator 3, in order to realize all or part of the function $g$, in contrast to the linear attenuator previously discussed. This intentional nonlinearity or controllability can be incorporated into the previously discussed different embodiments of attenuator 3. If the desired system amplitude transfer function is nonlinear, the attenuator 3 may equally well be placed on either side of amplitude detector 2, inasmuch as amplitude detectors 2 and 5 will not be operating at the same signal level in any case. Only if the system transfer function is linear is it particularly advantageous to place attenuator 3, as depicted in FIGS. 1 and 4, so that it precedes the detector 2.

A function generator can also be placed in the rf signal path between input 7 and amplitude detector 5, or can be included in the function performed by rf attenuator 3. For example, the rf transmission transfer function of this rf function generator can be made dependent upon frequency within the rf operating frequency range of the system. This can then cause the system amplitude transfer function to be dependent upon the rf frequency in order, for example, to compensate for known variations in the transmitting antenna radiation resistance versus frequency.

The system of FIG. 2 may likewise be modified to provide a power amplifier having any desired phase transfer function dependent upon input amplitude, input phase, operating frequency, or one or more external control signals, by so designing the control mechanism 11. In one such embodiment, the control circuitry 31 in FIG. 3 is arranged so that the signal applied via lead 21 to control phase-shift network 17 is proportional not to the output of phase detector 27 but rather to some function of the output of phase detector 27 or to one or more external control signals or to a functional combination of one or more control signals and the output of the phase detector.

The FIG. 2 system can also be modified by the insertion of a fixed or variable phase-shift network in path 19. The phase shift within the amplifier apparatus then is substantially equal to the phase shift of the inserted phase-shift network. The phase-shift network, if variable, can be controlled to provide any desired system phase transfer function. This embodiment is generalized by placing a second phase shift network in path 13, in a manner analogous to the generalization of the scheme in FIG. 4 by placing a function generator in the output signal path. The circuit of FIG. 3 represents a special case of the general scheme, viz. that in which the first phase-shift network provides a constant 180° phase shift (i.e. inverter 23) and the second phase-shift network provides a constant zero phase shift (i.e. a direct connection).

The present invention, in its most general form, resides in a high efficiency amplifier and signal processor whose output amplitude and output phase can be independent and arbitrary functions of the input amplitude, the input phase, and one or more amplitude-variant or phase-variant external control signals. Furthermore, the system amplitude and phase transfer functions can be caused to be desired functions of frequency within the rf operating frequency range. The desired operation of the invention is attained simply by utilizing function generators and phase-shift networks which have the proper functional dependences upon the desired parameters. Embodiments of the invention can be constructed which are especially adapted for specific uses, such as: amplitude modulator (output phase equal to input phase, output amplitude a linear function of one external control signal), phase modulator (output amplitude constant, output phase equal to input phase plus a linear function of one external control signal), amplitude compressor (output phase equal to input phase, output amplitude a nonlinear function of input amplitude), and various hybrid modulators and processors. The amplitude detector 5 may be omitted in those embodiments in which the output amplitude and phase are both independent of the input amplitude.

C. Superior Embodiments of the Linear Amplifier

In the special case of a linear amplifier, i.e. one in which the amplitude transfer function is linear and the phase transfer function is a constant time delay (or a constant phase shift which, subject to the conditions pointed out above, is approximately the same thing), embodiments of the invention can be constructed whose linearity is considerably superior to that obtained with the FIG. 1 or 2 systems. FIG. 5 shows the scheme of a linear rf power amplifier in which the potentially nonlinear amplitude detectors are eliminated, with a consequent improvement in system linearity. The rf input signal of magnitude $e_1$ and phase $\theta$ is applied to the input of the controlled variable phase-shift network 17 whose output provides the input to power amplifier 1. The output of power amplifier 1 is coupled by a network 35 to the output load (not shown). Coupling network 35 is of conventional design, and may provide impedance transformation (load matching) in addition to low-pass filtering (harmonic suppression). The output $e_2$ of coupling network 35 is also applied to attenuator 3 whose attenuation sets the system closed-loop gain. Inverter 23, flip-flops 25 and 29, phase detector 27, control circuitry 31, and variable phase-shift network 17 form a phase-control subsystem identical in design and operation to that previously described in connection with FIG. 3. This subsystem causes the phase of the signal at lead 12 to be identical to the phase of the signal at lead 19. The rf signal thus emerges from attenuator 3 with magnitude $e_2/k$ and phase $\theta$. The $e_1$ phase $\theta$ and $e_2/k$ phase $\theta$ signals are applied to the two inputs of an rf subtractor 37. The sense of the two inputs of rf subtractor 37 is chosen according to the input-output control sense of a synchronous detector 39, the control means 8, and power amplifier 1 such that an increasing amplitude of the signal at input $e_1$ causes the control means 8 to increase the signal output 13 from power amplifier 1. Subject to this condition, the sense of the two inputs of rf subtractor 37 with respect to its own output $e_3$ may be chosen arbitrarily. In the description which follows, it is assumed that signals $e_1$ and $e_2/k$ are applied to the non-inverting and the inverting inputs, respectively, of rf subtractor 37. The magnitude of the output $e_3$ of rf subtractor 37 is proportional to the difference of the magnitudes of signals $e_1$ and $e_2/k$; the output $e_3$ is of phase $\theta$ if the magnitude of signal $e_1$ exceeds the magnitude of signal $e_2/k$, and if the reverse is the case the output $e_3$ is of phase $\theta + 180°$. Thus the output $e_3$ contains the necessary magnitude and phase information from which to derive an error signal analogous to the output 10 of differential amplifier 4 in FIG. 1. The error signal is derived by applying the output of rf subtrator 37 to synchronous detector 39. Synchronous detector 39 may be of conventional design, for example a four-diode ring demodulator followed by a low-pass filter. The demodulator effectively multiplies the instantaneous value of the analog input signal (i.e., $e_3$) by the sign (i.e. + 1 or − 1) of the instantaneous value of the reference phase input signal. The low-pass filter then removes substantially all radio-frequency output components, leaving only those at dc and modulation frequency. As is known, the output of a synchronous detector is proportional to the magnitude of the analog input signal multiplied by approximately the cosine of the phase difference between the analog input signal and the reference phase input signal. (In some synchronous detectors, the appropriate function is not exactly cos $\phi$, but rather is a linear approximation thereto, e.g. $1 - 2/\pi\ |\phi|$. The operation of the present invention is not affected thereby.) The output 10 of synchronous detector 39 is a slowly-varying dc signal of absolute value proportional to the magnitude of $e_3$; the sign of the output 10 is positive if signal $e_3$ is of phase $\theta$, and is negative if signal $e_3$ is of phase $\theta + 180°$. The signal 10 is used by power output control means 8 to control the output of power amplifier 1 such that the amplitude of the output signal at lead 13 is proportional to the amplitude of the input signal at lead 7.

The rf subtractor 37 to which the $e_1$ and $e_2/k$ input signals are applied ideally has the same transfer characteric for both signals, but that characteristic need not be linear. Identical characteristics are easily achieved with passive linear components, since two linear transfer functions are inherently matched. Even a nonlinear subtractor is acceptable, provided the two (nonlinear) transfer characteristics are matched. Nonlinearity of the synchronous detector 39 or matched nonlinearity of the rf subtractor 37 does not significantly degrade the linearity of the full system. Nonlinearity of the rf subtractor 37 or of synchronous detector 39, however, does cause the open-loop gain of the system to be a function of signal level, but this is not a problem provided that the gain (i.e., the slope of the transfer characteristic) is at all signal levels sufficiently high to provide the desired minimum gain reduction factor for the feedback system, and sufficiently low to avoid instability of the feedback system.

It is evident from the foregoing description that the two inputs to the rf subtractor 37 must be maintained in like phase for proper operation of the full system. If the phase angle between the two inputs to the rf subtractor 37 differs by an error $\phi$ from the desired 0° phase difference, the closed-loop system gain is multiplied by the factor cos $\phi$, but neither distortion nor zero offset of the system is introduced. In some cases, it is practicable to hold the error angle $\phi$ to a sufficiently low value by using a fixed phase-shift network in place of the variable phase-shift network 17 and associated control circuitry. The fixed phase-shift network in such cases provides a phase shift approximately equal to the negative of the combined phase shifts of power amplifier 1, coupling network 35, and attenuator 3, over the operating frequency range. The phase shift of many conventional rf power amplifier coupling networks (e.g. elliptic-function filters) varies with frequency and load impedance in an extreme and complex manner; in such a case the input to the attenuator 3 may be taken at lead 34 instead of at lead 13, easing the requirements imposed upon the fixed phase-shift network.

It is to be noted that the phase control subsystem in FIG. 5 serves a dual purpose: first, it cancels phase distortion within power amplifier 1 or coupling network 35 in the same manner as the phase control subsystem in FIG. 2; second, it causes the two input signals to the rf subtractor 37 to be in the proper relative phase necessary to the functioning of the amplitude control subsystem. It is evident that the latter purpose could alternatively be served by locating the phase-shift network 17 either in lead 19 or in lead 12 immediately following or preceding attenuator 3. Both of these alternative embodiments are capable of insuring the proper phase relation between the two inputs to the rf subtractor 37. The system of FIG. 5 is, however, superior in two respects: first, phase distortion is cancelled as noted above; second, nonlinearities in the amplitude response of phase-shift network 17 do not degrade system linearity, as they would if the phase shift network 17 were placed in an amplitude-dependent point in the system (e.g. lead 19 or lead 12).

It is evident that an rf adder may be employed in place of the rf subtractor 37 which was used for simplicity of exposition. Indeed, the rf adder is preferred as it avoids the problem of common-mode feed-through which is present in rf subtractors. Where an rf adder is used, the phase control subsystem is arranged so that the phase difference between the $e_1$ and $e_2$ inputs to the rf adder is 180°. This is most easily accomplished by replacing inverter 23 with a direct connection. Indeed, an rf linear combiner of any relative phase shift may be employed provided that the phase control subsystem is arranged to supply $e_1$ and $e_2$ inputs to the rf linear combiner of the appropriate relative phase. For example, an rf linear combiner having an output equal to $e_1 + ie_2$, where $i$ is the square root of −1 (mathematically a + 90° phase shift), may be employed provided that the phase control subsystem is arranged to supply an $e_2$ input of phase + 90° with respect to $e_1$. The reference phase input to synchronous detector 39 may be any signal, however obtained, of the rf frequency, and of phase approximately equal to that which would be observed at the output of the rf linear combiner were the signal $e_2$ of zero magnitude. A phase error $\phi$ from this theoretically proper reference phase will cause the system open-loop gain to be multiplied by a factor cos $\phi$; if $\phi$ is small, this is not harmful. In any case, the polarity of the output of synchronous detector 39 must be arranged so that the amplitude control system operates in the negative-feedback mode.

When the system is operating properly, it is immaterial whether the reference phase input to the synchronous detector 39 is obtained from the signal $e_1$ or from the signal $e_2/k$ (or, indeed, from any nonzero algebraic combination of the two aforesaid signals), since both are of phase $\theta$. When there is a phase error $\phi$, however, the closed-loop gain of the former system is proportional to sec $\phi$, and that of the latter system is proportional to cos $\phi$. The latter scheme is therefore illustrated in FIG. 5, since it is generally preferable that a circuit malfunction (or turn-on transient condition) should cause decreased rather than increased power output. Since sec $\phi$ and cos $\phi$ have opposite variations, certain combinations of synchronous detectors using $e_1$ and $e_2/k$ as their reference phase inputs may be employed to provide a system gain which is substantially independent of the error angle $\phi$. The use of such a compensating scheme may permit, if desired, the complete elimination of the phase control subsystem, as the error angle $\phi$ will now be irrelevant. Consider, for example, two identical synchronous detectors, each having as its analog input the output $e_3$ of rf subtractor 37, and employing $e_1$ and $e_2/k$, respectively, as reference phase inputs. Let the power output controller 8 be driven by a signal proportional to the sum of the outputs of the synchronous detectors. This signal will be equal to $$G\,(\,|e_1| - |e_2/k|\,)\,(1 + \cos\phi),$$

where $|e_1|$ and $|e_2/k|$ are the magnitudes of the signals $e_1$ and $e_2/k$, respectively, G is a gain factor, and $\phi$ is the phase angle between the $e_1$ and $e_2/k$ signals. If G is large, and $\phi$ is not near 180°, the closed-loop system gain will be equal to $k$, independent of $\phi$. In practice, however, the two synchronous detectors are not identical. Any difference between the transfer characteristics of the two synchronous detectors causes the closed-loop system gain to vary as a function of signal level, causing distortion. This is remedied in the scheme of FIG. 6. Limiter/adder 41 has three output states: + 1 if both input signals are (instantaneously) positive, 0 if they have opposite signs, and − 1 if both are negative. Synchronous detector 43 is unconventional in that it is capable of multiplying the analog input signal by + 1, 0, or − 1, as the case may be, rather than merely by + 1 or − 1 as in a conventional two-state synchronous detector such as detector 39. The three-state synchronous detector is, however, easily realized by a minor modification to the two-state detector to cause zero output (prior to filtering) whenever the reference phase input is (instantaneously) in state 0. It is seen that the circuit of FIG. 6 is mathematically identical to the pair of synchronous detectors discussed above. By merging the two synchronous detectors into a single three-state synchronous detector 43, identical transfer characteristics are insured.

In the circuit of FIG. 6, the closed-loop system gain is independent of $\phi$ only if $\phi$ is not near 180°. Moreover, the open-loop system gain varies as $(1 + \cos\phi)$, causing the system to be difficult to stabilize. Both of these problems are eliminated in the circuit of FIG. 7, which contains in addition a second group of elements similar to those of FIG. 6 but with an rf adder 45 in place of an rf subtractor, and a three-state digital subtractor 47 in place of a digital adder. The outputs of the synchronous detectors 43 and 49 are summed in summer 51 and used as before to drive the power output control means 8. It may be seen that the combination of the elements 45, 47, and 49 produces exactly the same function as the combination of the elements 37, 41, and 43, except that the $e_2/k$ input is effectively 180° phase-shifted. The former combination therefore has an output proportional to $(1 + \cos(\phi + 180°)) = (1 - \cos\phi)$. Provided that the two combinations have the same gain, the summed output 10 is of the form $G(|e_1| - |e_2/k|)$, and all effects of $\phi$ are cancelled out. If the gains are slightly different, the system open-loop gain will depend slightly on $\phi$, but the system open-loop gain will always be large if G is large (unlike the system of FIG. 6 in which the open-loop gain goes to zero at $\phi$ = 180°). The closed-loop system gain is $k$, independent of $\phi$. A minor difficulty exists in the circuit of FIG. 7 if the gain ratio between the two inputs to the rf subtractor 37 is not equal to the same ratio in the rf adder 45 (that is, if the subtractor 37 produces $(e_1 - ae_2/k)$ while the adder 45 produces $(e_1 + be_2/k)$, $a \neq b$). This can occur due to tolerances in the components making up the subtractor 37 and the adder 45. If this is the case, variations in $\phi$ can cause small variations in the closed-loop system gain, and nonidentical nonlinearities in the synchronous detectors 43 and 49 can cause distortion. Whereas in previous circuits nonidentical nonlinearities would cause distortion of the same relative order as the amount of difference between the transfer characteristics concerned, in the circuit of FIG. 7 the distortion is of the order of the difference between the transfer characteristics multiplied by the relative gain ratio mismatch between subtractor 37 and adder 45, approximately two orders of magnitude smaller for a typical case employing presentday precision components.

The arrangements of FIGS. 6 and 7 may be further modified to eliminate the necessity for the three-state digital adders/subtractors 41/47 and the three-state synchronous detectors 43/49. Consider, for example, the output of the three-state digital adder 41. It is a symmetrical periodic wave of the rf frequency, and of values: + 1 for some duration of time in which both inputs are positive; 0 when one input has gone negative while the other remains positive (the remainder of the half-cycle); − 1 when both inputs are negative, for a duration equal to the duration of the state + 1; and 0 when the first input has become positive while the other remains negative, for a duration equal to the duration of the other 0 state. The three-state synchronous detector 43 effectively multiplies its analog input signal by the above reference phase input wave, and then averages the result over a period of at least one rf cycle. The analog input signal is the output of the rf subtractor 37, a sine wave of the same rf frequency as the reference phase input. Consider now what would happen if, for example, the reference phase input were not zero when the two inputs to the adder 41 are of opposite sign, but were rather some fixed value $a$ ($a \neq 0$). During that portion of the first half-cycle in which the two inputs to the adder 41 are of opposite sign, the (pre-filtering) output of the synchronous detector 43 will exceed its "proper" value by amounts equal to the instantaneous values of the analog input signal sine wave multiplied by $a$. During the corresponding portion of the second half-cycle, however, the analog input signal sine wave will have exactly equal and opposite instantaneous values, while $a$ remains fixed, and therefore an exactly equal and opposite quantity will be added to the output of the synchronous detector 43. When averaged over a full cycle, therefore, the two errors cancel each other, and the nonzero value of $a$ has no net effect. In particular, therefore, $a$ may be made equal to + 1 (or − 1). This permits a conventional two-state synchronous detector to be employed at 43. Adder 41 becomes merely a positive-logic OR gate (or AND gate). In the circuit of FIG. 7, the present modification may be employed in the combination 41/43 and- /or in the combination 47/49, and $a$ may be chosen independently in the two combinations. The present modification should not be employed if the analog input signal "sine wave" contains appreciable evenharmonic distortion, as the errors of opposite half-cycles would not then necessarily cancel.

The term "synchronous detector" as used herein is intended to include not only the two-state and three-state synchronous detectors previously described, but in addition the multi-state and analog-multiplier equivalents thereof. In general, a synchronous detector is any device which, in response to two periodic input signals of the same rf frequency, produces an output proportional to the magnitude of one of the said input signals and to approximately the cosine of the phase angle between the fundamental frequency components of the two input signals.

All the foregoing linear amplifier systems (viz., those of FIGS. 1, 2, 5, 6, and 7) are based on the concept of deriving an amplitude error signal 10 dependent upon the difference between the desired rf output amplitude (viz. the rf input amplitude 7 multiplied by a constant gain factor) and the actual rf output amplitude 13. The well known principles of negative feedback systems operate to cause the error signal 10 to be very nearly zero. In the systems of FIGS. 1 and 2, this fact is reflected in a corresponding near-equality of the input signals a and b to the differential amplifier 4. As pointed out above, the proportionality of the amplitudes of the signals 7 and 13 that follows from this near-equality of the signals $a$ and $b$ is dependent upon a matching of the transfer characteristics of the respective signal paths. Although the systems of FIGS. 1 and 2 are, for reasons expounded above, superior to the modified FIG. 1 system in that they permit a more exact matching of the respective transfer characteristics, even the former systems are subject to distortion resulting from unmatched nonlinearities in the amplitude detectors 2 and 5. In the systems of FIGS. 5 through 7 this defect is remedied by effectively subtracting the amplitudes of the respective rf signals prior to, rather than subsequent to, the potentially-nonlinear detection process. This is accomplished in the system of FIG. 5, for example, by locating the rf subtractor 37 before the synchronous detector 39 inasmuch as it is well known that an rf subtractor may be realized, using passive linear components, to have no appreciable nonlinearity. Nonlinearity of the synchronous detector 39 can only cause the system open-loop gain to vary somewhat with signal level; the system closed-loop gain, the constancy of which is necessary to the linearity of the full system, does not significantly vary with signal level.

The systems of FIGS. 5 through 7 are illustrative of the superior linear amplifier forms of the invention. Other arrangements can share the superiority of the systems of FIGS. 5 through 7 over those of FIGS. 1 and 2, provided those arrangements retain the basic concept of linearly combining the rf input and output signals 7 and 13 prior to, rather than subsequent to, the potentially-nonlinear amplitude detection process.

D. Alternate Form of a System which Includes Frequency Translation Inside the Feedback Loop FIG. 8 schematically shows an embodiment of the invention having a frequency translator inside the feedback loop. This embodiment reduces the distortion in the signal at the output 13 introduced by the nonlinearity or offset of the amplitude transfer function of the frequency translator 9 in the FIG. 2 system. The FIG. 8 arrangement exchanges the requirement of matched amplitude detectors 2 and 5 for a requirement for frequency mixers 53 and 55 having closely matched amplitude and phase transfer functions. In certain circumstances this may be an advantageous exchange, depending on the characteristics of the components available for amplitude detectors and for mixers. The mixers 53 and 55 are selected for their close match when their input frequences differ, as is the case here.

Mixer 55 and a local oscillator 59 together comprise one way of realizing the frequency translator 9. The input signal at terminal 7 is at a frequency $f_1$, local oscillator 59 provides a signal at a frequency $f_2$, and mixer output 19 is at a frequency $(nf_1 \pm mf_2)$, where $n$ and $m$ are each a positive or negative integer. For example, the case $n = m = +1$ is discussed here. Hence the frequency at mixer output 19 is $(f_1 + f_2)$; that signal is made one of the inputs to the rf subtractor 37. Then for the rf subtractor 37 to operate properly, its other input must also be at frequency $(f_1 + f_2)$. But the output 13 of power amplifier 1 is at a frequency $(f_1 + f_2)$, the same as that of the power amplifier input (19 in this case). If the local oscillator 57 is at a frequency of either zero (i.e., dc) or 2 $(f_1 + f_2)$, the output 61 of mixer 53 can be made to be at $(f_1 + f_2)$, as required for rf subtraction against signal 19. The overall system distortion becomes small as the transfer functions of mixers 53 and 55 become closely matched; these transfer functions need neither be linear nor free of offset. The reason is entirely analogous to that already expounded regarding the minimization of distortion which accompanies the matching of amplitude detectors 2 and 5. Note that a zero-frequency local oscillator 57 is a degenerate case of simply using an existing dc power supply already present to supply power to other circuits. Where mixer 53 is of the type which requires an ac signal from its local oscillator, the frequency 2 $(f_1 + f_2)$ can be obtained simply from a frequency doubler of standard and well-known design which has signal 19 as an input.

The FIG. 8 embodiment can also make use of the methods previously described in connection with FIGS. 3, 5, 6 and 7, for rendering the rf subtraction process relatively insensitive to the rf phase shift in power amplifier 1 and for controlling the rf phase independently of the rf amplitude. The FIG. 8 embodiment can also be modified to employ the function-generator techniques described in connection with FIG. 4 to provide an accurately controlled nonlinear transfer function which also includes frequency translation.

E. Equality of Propagation Delay

All of the foregoing systems are based upon the concept of splitting the input signal into an amplitude component and a phase/frequency component. These two components are processed separately. The amplitude component is processed in a circuit which need not preserve phase (e.g., an amplitude detector), and the phase/frequency component is processed in a circuit which need not preserve amplitude (e.g., a switching amplifier). The original signal is then reconstructed at the output by properly combining the two components. It is clear that when the amplitude component is to be reinserted (i.e., at power amplifier 1), it must bear the same time relation to the phase/frequency component at the point of reinsertion as did the original amplitude component to the original phase/frequency component. In other words, the propagation delay through the amplitude channel must equal the propagation delay through the phase/frequency channel, in order that the input signal be reconstructed correctly at the output. In some cases, it may be necessary to insert a delay element into one or both of the paths for no other purpose than to cause precisely this equality of delay. The inequality of delay should be very small compared to a cycle time of the highest modulation frequency, in order to avoid causing significant distortion.

F. Power Output Control

The power output control means 8 employed in the invention must, in conjunction with the driving means connected to the rf power amplifier 1, be capable of varying the output amplitude of the rf power amplifier 1 from the minimum value of the amplitude of the desired output signal to the maximum value thereof. In general, this requires control over the entire range from zero output to full output, even though for some applications (e.g., amplitude modulation of less than 100%) the requirement is less severe.

The power output control means 8 can employ any of the following methods:

1. Control of the "dc" power supply for the output stage of power amplifier 1, and optionally, for one or more earlier stages. "Dc" is in quotation marks to signify that the supply is not pure dc, as the "dc" supply is intentionally made to vary with the amplitude control signal 10. This control of the "dc" power supply can be by means of:
   a. a switching regulator, providing nearly-zero power loss.
   b. a dissipative direct-coupled regulator.
   c. an ac-coupled Class B, Class AB or Class A modulator.
   d. a switching regulator augmented for response to higher modulation frequency by addition of an ac-coupled Class B, Class AB or Class A modulator.
2. Control of the rf cycle duty ratio of one or more of the rf power output active devices. At present, such active devices most commonly are transistors or electron tubes.
3. Control of the "dc" bias level or the rf input drive magnitude supplied to the control electrodes (e.g., transistcr emitter-base junction or electron-tube grid-cathode circuit) of one or more stages of the rf power amplifier 1, if the stage be of a type (e.g., a conventional Class A, AB, B, or moderately-driven Class C amplifier, or a pentode or tetrode electron tube with screen voltage control) permitting the rf power output of rf power amplifier 1 to be varied over a sufficiently-wide range by control of said bias or drive magnitude. Control of the "dc" bias level is established practice for amplitude-modulation transmitters operated with grid-bias or base-bias modulation or screen modulation, and is described, for example, in *Radio Engineering*, F. E. Terman, McGraw-Hill, N.Y., Third Edition, 1947, Section 9-3, pp. 474–479. Control of the rf input drive magnitude may be accomplished by applying the aforesaid control of "dc" bias level or "dc" power supply to a preceding stage(s), or by inserting in the drive circuit a controlled rf attenuator of generally well known character (e.g. PIN diode). Being established practice, these techniques will not be discussed further.
4. Combinations of the above, as appropriate to best meet the requirements of a particular application.

1. Control of DC Power Supply with Switching Regulator

A typical switching regulator is described in "Comparative Analysis of Chopper Voltage Regulators with LC Filter", O. A. Kossov, IEEE Trans. on Magnetics, Vol. MAG-4, No. 4, December 1968, pp. 712–715. A single-pole double-throw switch (usually realized as a transistor and a diode) connects either the prime power source voltage or zero volts to the input of a low-pass filter (usually a single-section L-C filter) whose output feeds the load. In this case the load is the "dc" power supply port of the output stage of the rf power amplifier 1, and optionally, one or more of the preceding stages. As depicted in FIG. 11A, the modulator governs the frequency and the pulse width at which the switch 8B is cyclically operated. This modulator may operate by varying either the frequency or the pulse width or both. In all cases, the duty ratio (viz., frequency times pulse width) is governed by the control signal 10. A low-pass filter smooths the cyclically-switched voltage to present esentially ripple-free voltage to the load, in order to avoid generating spurious switching-frequency amplitude modulation of the rf output 13. Essentially ripple-free voltage is supplied to the load if the low-pass filter cutoff frequency is enough lower than the switch operating frequency. The "dc" voltage is then substantially equal to the prime power source voltage multiplied by the switch duty ratio.

The advantage of such a switching regulator is that it can control the voltage supplied to its load with almost zero power loss in both the switch and the filter. Little power is lost in the switch because current flows through only a low voltage drop of the switch conducting pole, and because the "off" pole of the switch, which has a high voltage across it, has essentially zero current flow. Thus, power loss, the product of voltage across the switch pole and current through it, is low for both "on" and off poles of the switch. Little power is lost in the low-pass filter because the filter inductor, having almost zero dc resistance, causes little $I^2R$ power loss.

A limitation of such a switching regulator, when used in a control system as is the case here, is that the low-pass filter places a limitation on the response of the amplitude control sub-system to high modulation frequencies. Another limitation of the switching regulator is that the entire system acts as a sampled-data control system in which the sampling frequency ($f_s$) is the pulse repitition rate of the switching regulator. The sampling process is approximately equivalent to a low-pass transfer function with a cutoff frequency of $f_s/2$. For example, the simplest type of sampled-data system (sample and hold) is closely equivalent to a second-order low-pass transfer function of cutoff frequency $f_s/2$ and damping constant 0.7 in the system forward transfer path, for signal frequencies less than $f_s/2$. At signal frequencies of $f_s/2$ or larger, aliasing occurs, and a simple non-sampling "equivalent" is no longer an adequate description. Thus the low-pass and aliasing characteristics of a sampled-data system invoke a basic limitation of $f_s/2$ as the highest possible modulation frequency at which a switching-regulator type of power output control means can control effectively, in addition to the limitation caused by the low-pass filter. Another reason for control-frequency limitations when feedback is used is that both the sampling process and the low-pass output filter insert low-pass transfer functions into the open-loop characteristic of the control system. Both of the low-pass transfer functions contribute to the phase lag in the open-loop characteristic of the control system, and the phase lag sets limitations on the closed-loop bandwidth and gain reduction factor which can be achieved while still maintaining system stability against excessive ringing in response to input transients, or, in the extreme, against system oscillation. When a control system using a switching regulator is designed for accurate control, good attenuation of switching ripple, and good stability against oscillation, the typical result is a cutoff frequency of the closed-loop control characteristic of the order of $f_s/10$ or less.

The power loss in a switching regulator increases with switching frequency. Thus a design compromise must be made between amplitude control frequency capability (higher switching frequency gives higher control frequency capability) and efficiency (higher switching frequency causes higher power losses, and hence lower efficiency).

2. Control of DC Power Supply with Dissipative Direct-Coupled Regulator

A dissipative direct-coupled regulator can be a conventional dc voltage regulator of the type shown in *Electronic Designers' Handbook*, R. W. Landee, D. C. Davis, and A. P. Albrecht, McGraw-Hill, N.Y., 1957, Figure 15.30, except that the "reference voltage" is a time-varying signal dependent on the control signal 10, rather than a fixed voltage. FIG. 11B depicts, in block diagrammatic form, the use of a dissipative direct-coupled regulator 8D to control the power from the voltage supply 8C that is applied to power amplifier 1. The disadvantage of this type of regulator is that its power loss is much larger than that of a switching regulator. Its advantage is that it can control the rf amplitude at higher modulation frequencies than can the switching regulator.

3. Control of DC Power Supply with AC-Coupled Modulator

The supply voltage for the output stage can be supplied from an ac-coupled (e.g. transformer-coupled) Class A, AB, or B modulator whose signal input is the amplitude control signal 10. The ac voltage from the modulator output is added arithmetically to the dc supply voltage (e.g. by placing the modulation transformer secondary in series with the dc supply) to provide the supply voltage for the power output stage of the rf power amplifier 1 (and, optionally, one or more of the preceding stages). This arrangement has been commonly used in the past for amplitude-modulation transmitters, and is described, for example, in Terman, op. cit., Section 9–2, pp. 470–474. The efficiency of this method is greater than that of the dissipative direct-coupled regulator, but less than that of the switching regulator.

4. Control of DC Power Supply with Switching Regulator and AC-Coupled Modulator

The ac-coupled modulator method of power output control meets many application requirements, but it cannot by itself meet the most general requirement for a power amplifier whose amplitude can be made to be an arbitrary, continuous, bounded function of time. This is because the response of the amplitude control system does not extend down in frequency to dc. However, this method can be used in conjunction with other methods which do extend to dc, such as the switching regulator discussed above. Such an arrangement is schematically shown in FIG. 11D where the dc power supplied to power amplifier 1 is controlled by the combination 8P of an ac-coupled modulator and a switching regulator. The advantage of using the ac-coupled modulator either alone or in combination with one which can operate at frequencies down to dc is that amplitude control can be accomplished at higher frequency than may be possible within the limitations of the switching regulator described above. It may still be possible to control the rf amplitude with high efficiency in the combined-technique scheme described here because usually the major portion of the amplitude control power is at low frequencies, where the low-frequency (e.g., switching regulator) control operates satisfactorily and with high efficiency. The high-frequency amplitude control power usually is of relatively small magnitude, so a less efficient high-frequency control method can still yield satisfactory overall power efficiency while yielding an overall control means whose frequency capability may be superior to that of the switching regulator alone.

6. Control of RF Cycle Duty Ratio

The principle involved in this method of power output control will first be illustrated by a rudimentary embodiment. Unipolar or bipolar rectangular pulse trains may be represented by well-known Fourier series, in which the coefficients of the various terms depend on the duty ratio of the unipolar pulse train or on the duty ratios of the positive and negative pulses in the bipolar pulse train. Letting the pulse train represent the signal being used to drive the output stage of the rf power amplifier 1 (e.g., if it is a class D amplifier stage), it will be seen that the amplitude of any particular frequency component of the output spectrum (e.g., the fundamental), and hence the post-filtering amplitude of the signal at output 13 of the rf power amplifier 1, may be controlled by controlling the duty ratio of the driving pulses. In the usual case in which the rf power amplifier 1 is not a frequency multiplier, and hence the fundamental-frequency component is the desired component, a linear open-loop control characteristic may be obtained by causing the pulse width to be (in radians) twice the arcsine of the relative control voltage 10, as may be seen upon examination of the appropriate Fourier series. It should be emphasized, however, that the closed-loop control characteristic will, as a result of the feedback action of the full system, be substantially linear even if the open-loop characteristic is nonlinear, as long as the latter is monotonic. In particular, the arrangement depicted in FIG. 10 provides a pulse width proportional to the control voltage 10, rather than to the arcsine thereof, and hence the open-loop control characteristic is nonlinear; but minimal degradation of the full system linearity results therefrom. As is well-known from the theory of feed-back control systems, the closed-loop nonlinearity is equal to the open-loop nonlinearity divided by the gain reduction factor: (open-loop gain)/(closed-loop gain). Further details of the theory of this form of amplitude control, in the particular case in which the fundamental-frequency component is the desired component, may be found in U.S. Pat. No. 3,363,199. Similar considerations apply if the power amplifier 1 is used in a frequency-multiplying mode, wherein the desired output frequency at output 13 of power amplifier 1 is a harmonic of the fundamental frequency appearing at the input of power amplifier 1.

The method of power output control by control of rf cycle duty ratio may also be applied to the case of non-rectangular pulse trains. For example, if the output stage is a Class C amplifier with sine-wave drive, the appropriate pulse train to consider would be a train of truncated sinusoids, respectively unipolar or bipolar as the stage is single-ended or push-pull. Such a pulse train may also be represented by a Fourier series, quantitatively different from that of the rectangular pulse train, but in which the various coefficients likewise are dependent on the rf cycle duty ratio (in this case often called the "conduction angle").

The rf power output of rf power amplifier 1 can therefore be controlled by controlling the duty ratio of the rf cycle appearing at the output stage of the rf power amplifier 1. The details of how this is accomplished depend on the particular kind of power output stage (e.g., Class D or Class C) and whether its output is tuned or untuned. In all cases, however, control of the rf cycle duty ratio should be accomplished in such a way that the centroid of the individual rf cycle output pulse from the power output device (e.g., the output transistor or tube) occurs at a time which has a fixed time relationship (e.g., a fixed delay time) with respect to the peak of the individual cycle of the rf input. If this is done, the rf output 13 does not suffer a spurious phase modulation at the amplitude control frequency. Spurious phase modulation occurs where, for example, rf pulses are generated by a means which starts the rf pulse at a controllable time within the input rf cycle according to the rf output amplitude desired and ends the rf pulse at a time which is fixed in the rf cycle. An example of a means for controlling the rf cycle duty ratio in this undesirable way is shown in Landee, Davis and Albrecht, op. cit., FIG. 5.42. That figure illustrates a technique for duration modulation of the pulses in a repetitive pulse train, wherein the pulse repetition rate corresponds to the instantaneous radio frequency in the system considered here and the duration-modulated pulses correspond to the individual duty-ratio-controlled rf cycles. That undesirable means can be converted to desirable means by changing the repetitive sawtooth waveform shown there to one which has identical rise and fall times rather than the essentially-zero fall time shown. A method for generating the desired duty ratio control is discussed below.

Controlling the rf output amplitude by means of the rf cycle duty ratio is also a sampling process, similar to that discussed above for the switching regulator control of the "dc" power supply for the rf power output stage. However, the sampling rate in this case is once or twice per rf cycle, respectively, for the two different types of rf cycle duty ratio control discussed below. Thus, the control frequency capability can be extended substantially beyond that of a system using the switching-regulator approach. This is because, firstly, $f_s$ becomes 1 or 2, respectively, times as large as the instantaneous radio frequency and, secondly, the low-pass switching ripple filter of the switching regulator is eliminated.

For clarity the two rf cycle duty ratio control methods are described in connection with the waveforms depicted in FIGS. 9 and 10. The embodiments depicted below are not necessarily the most practicable of application, but are chosen for simplicity of exposition. A superior set of embodiments which is more difficult to comprehend, but is functionally equivalent, is the subject of a separate application for Letters Patent of the United States. FIGS. 9C to 9F show examples of the rf outputs which result from the two control methods which yield one and two samples per rf cycle respectively. These outputs result from appropriate drive signals being applied to the voltage-switching Class D power amplifier symbolically indicated in FIG. 9A. The switches S1, S2 and S3 depicted in FIG. 9A can be realized by transistor switches of generally well-known character and design. If one sample per rf cycle is used, the fundamental-frequency rf output amplitude is varied between zero and the maximum possible value by turning S2 on for a time which varies between zero and half the rf period, respectively, while S1 is on for the remainder of the period. The time that S2 is to be on is determined by the control signal 10 and its time derivatives existing at the time of sampling. If two samples per rf cycles are used, the on times of S1 and S2 are each individually controlled between zero and half the rf period, S2 being on within the half-cycle in which the load current is positive, and S1 being on within the half-cycle in which the load current is negative. S3 is on during the time that S1 and S2 are both off.

Figure 10A:
Figure 10B:
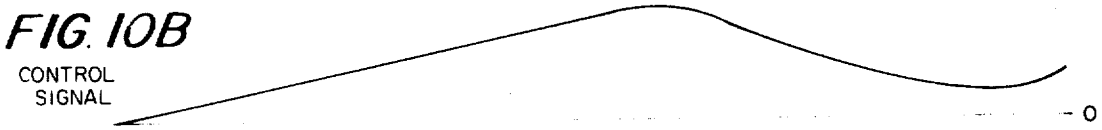
Figure 10C:
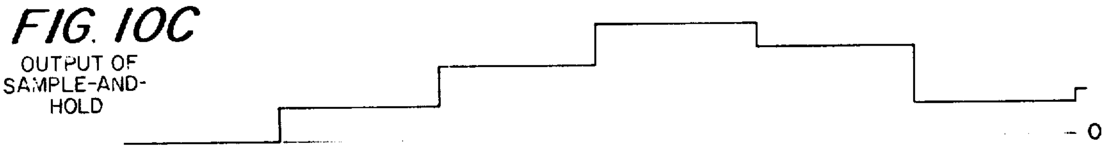
Figure 10D:
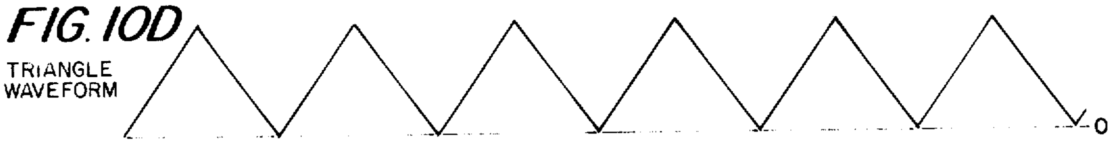
Figure 10E:
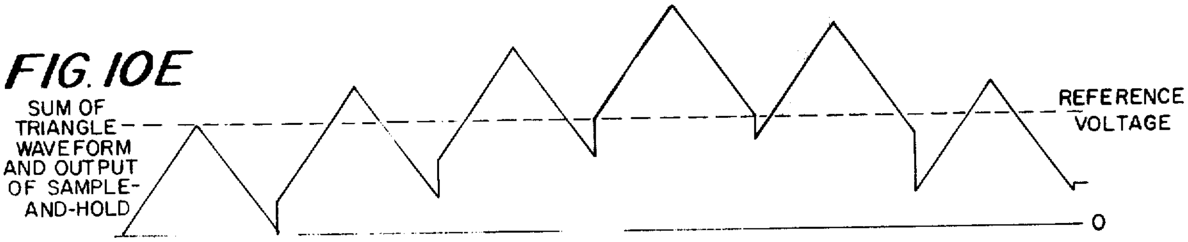
Figure 10F:
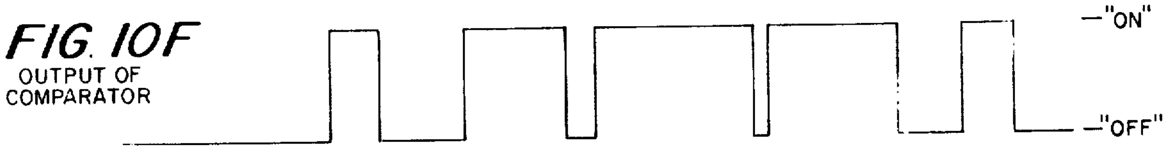

The waveforms of FIGS. 10A through 10F illustrate one method of achieving the desired control of rf cycle duty ratio. Alternative methods are given in U.S. Pat. No. 3,363,199. In the scheme of FIG. 10, the control signal shown in FIG. 10B is processed by a sample and-hold circuit which samples at the zero-crossing times of the rf input signal shown in FIG. 10A. The result is the waveform of FIG. 10C which is added arithmetically to a repetitive triangular waveform, shown in FIG. 10D, whose minimum extremum is taken to be at zero volts and whose peak-to-peak range is not greater than the range of the control signal. The resulting waveform, shown in FIG. 10E, is applied to a comparator which has a reference input equal to the most positive value of the triangular waveform. The comparator output, as indicated in FIG. 10F, is on when the sum waveform voltage exceeds the reference voltage and is off when the waveform does not exceed that voltage. The on time of the comparator output thus varies between zero and the full period of the triangular wave as the control input varies between zero and the maximum value of the triangular wave, respectively. The triangular wave period is made equal to a half-period of the rf input signal, with the triangle-wave minima occurring at the times of the rf input signal zero-crossings, and the triangle-wave maxima occurring at the times of the minima and maxima of the rf input signal. Alternate cycles of the comparator output are used to control S2 such that S2 is on within the aforesaid cycles during the time that the comparator output is on. In the scheme which uses one sample per cycle, S1 is on during the entire remaining time that S2 is off, and the other set of alternate cycles of the comparator output is not used. If two samples per cycle are being used, the comparator output during this other set of alternate cycles is used to control the conduction of S1 similarly to the way S2 is controlled.

It is to be noted that the above comparator function may sometimes be performed by an amplifier stage of power amplifier 1, the threshold of such "comparator" being the cutoff voltage of the active device (e.g. transistor or vacuum tube) comprising such amplifier stage. Noting also that the triangle waveform of FIG. 10D may be replaced by a sinewave centered at zero volts and of frequency equal to that of the rf input signal of FIG. 10A, it is seen that control of the "dc" bias level of, for example, a Class C amplifier with sine-wave drive, constitutes a method of controlling the rf cycle duty ratio in accordance with the principles illustrated above. Insofar as such control of "dc" bias level affects the amplitude, as well as the width, of the output current pulses of the Class C amplifier, this method of power output control constitutes a combination embodiment (method 4 above) comprising both rf cycle duty ratio control (method 2 above) and stage gain control by control of "dc" bias level (method 3 above).

The sample-and-hold processing prevents spurious phase modulation of the radio frequency output 13 which can result if the amplitude control signal itself is directly added to the triangular waveform and if its rate of change is large enough in comparison with the radio frequency. This spurious phase modulation occurs because the time position of the leading edge of the radio-frequency pulse is related to the value of the amplitude control signal at the time of the said leading edge, prior to the peak of the rf input signal, while the trailing edge is related to the value at a similar time subsequent to the peak of the rf input signal. If the two values of the amplitude control signal are not identical, the leading and trailing edges of the pulse will not occur at equal time displacements on either side of the time of the peak of the rf input. Then the centroid of the rf pulse will not occur at the peak of the rf input and spurious phase modulation will have been produced.

At high radio frequency, it may be impracticable to perform a sample-and-hold operation at two times the radio frequency. The sample-and-hold function may be performed at any integer submultiple of one or two times the radio frequency, provided the lower frequency gives a satisfactorily high value of $f_s$, considered in light of the modulation frequency range to be encountered in the particular application at hand. Alternatively, the sample-and-hold process may be omitted entirely if the amplitude control rate is sufficiently small relative to the radio frequency that the spurious phase modulation of the radio frequency is acceptably small. Other methods of preventing or compensating for the spurious phase modulation will be apparent to those ordinarily skilled in the art, now that the need therefor has been shown and one method therefor has been illustrated.

6. Combinations of the Above Methods

It is mentioned above that combinations of the foregoing power output control techniques may be advantageous in some circumstances. One such scheme is shown in FIG. 11C where a switching regulator is used in combination with a dissipative regulator to control the dc power supplied to power amplifier 1. Another such scheme combines control of the "dc" power supply for the output stage of the rf power amplifier 1 with control of the rf input drive magnitude to the aforesaid output stage. Actual rf power output active devices (e.g. transistors or electron tubes) have interelectrode capacitances which cause feedthrough of a small rf signal from the input circuit to the output circuit. If control of the "dc" power supply for the output stage of the rf power amplifier 1, by one of the methods 1 (a) through (d) above, is employed alone, there may be nonzero rf output amplitude even when the "dc" power supply voltage is reduced to zero, due to the interelectrode feedthrough described above. This nonzero output amplitude produces distortion, for example, in a single-sideband signal of two equal tones. This may be remedied by applying one or more of the methods 3, above, to reduce the rf input drive magnitude to the output stage of rf power amplifier 1, as the desired rf output amplitude approaches zero.

MODIFICATIONS OF THE INVENTION

It is evident that other combinations of the foregoing power output control techniques may be advantageous in certain applications, and will be apparent to those ordinarily skilled in the art.

In light of the foregoing disclosure, it will be appreciated that the present invention constitutes a broad class of power amplifier systems. While the basic concept of the invention provides for deriving an amplitude error signal dependent upon the difference between the desired output signal amplitude and the actual output signal amplitude, and for employing the error signal to control the output signal amplitude in a negative-feedback manner so as to reduce the amplitude error, (and/or for similarly controlling the phase of the output signal), each of these functions is susceptible of numerous embodiments. The amplitude error signal may be derived by amplitude detection of the input and output signals, and subtraction of the detector outputs (as, for example, in the systems of FIGS. 1, 2, and 4 herein); or the error signal may be derived directly from the instaneous rf input and output signals by any of a number of means (as, for example, in the systems of FIGS. 5 through 8 herein). Control of the amplitude of the output signal may be accomplished through any of several means for controlling the "dc" power supply voltage to one or more power amplifier stage(s); through any of several means for controlling the pulse width of the rf signal applied to the rf power output active device(s); through any of several means for controlling the "dc" bias level and/or the rf input drive magnitude to one or more power amplifier stage(s); or through combinations of the above methods. The power amplifier may employ amplifier stages of any of several well-known types; especially advantageous are the highly-efficient switching-type power amplifiers.

We claim:

1. In a signal processing system of the type having 1. a system input terminal for receiving the signal to be processed,
2. a system output terminal at which the processed signal is provided,
3. a power amplifier having its output fed to the system output terminal,
4. means coupling the system input terminal to the input of the power amplifier,
5. control means for controlling the amplitude of the output of the power amplifier,
6. a differential amplifier having its output connected to the control means and emitting an error signal thereto in response to the input signals applied to the differential amplifier,
7. means providing a first signal path connecting the system input terminal to a first input of the differential amplifier, the first signal path having in it an amplitude detector, 8. means for sensing the output of the power amplifier and providing an electrical signal related thereto, and
9. means providing a second signal path connecting the output sensing means to second input of the differential amplifier, the second signal path having in it an amplitude detector, the improvement wherein at least one of the first and second signal paths has a non-linear function generator in it which acts upon the signal fed by that path to the differential amplifier.

2. The improved signal processing system according to claim 1, including the further improvement wherein the means coupling the system input terminal to the input of the power amplifier includes a frequency translator which emits a signal to the power amplifier whose frequency is related to but different from that of the signal at the system input terminal.

3. The improved signal processing system according to claim 1, including the further improvement wherein the means coupling the system input terminal to the input power amplifier includes a variable phase shifter and wherein the signal processing system further includes 10. means for controlling the variable phase shifter,
11. a phase detector,
12. means for coupling the system input terminal and the system output terminal to different inputs of the phase detector, and
13. the phase detector emitting a signal to the means for controlling the variable phase shifter which determines the amount by which the input signal to the power amplifier is shifted in phase.

4. In a signal processing system of the type having 1. a system input terminal for receiving the signal to be processed,
2. a system output terminal at which the processed signal is provided,
3. a power amplifier having its output fed to the system output terminal,
4. means coupling the system input terminal to the input of the power amplifier,
5. control means for controlling the amplitude of the output of the power amplifier,
6. a differential amplifier having its output connected to the control means and emitting an error signal thereto in response to the input signals applied to the differential amplifier,
7. means providing a first signal path connecting the system input terminal to a first input of the differential amplifier, the first signal path having in it an amplitude detector,
8. means for sensing the output of the power amplifier and providing an electrical signal related thereto, and
9. means providing a second signal path connecting the output sensing means to a second input of the differential amplifier, the second signal path having in it an amplitude detector, the improvement wherein the means coupling the system input terminal to the input of the power amplifier includes a frequency translator which emits a signal to the power amplifier whose frequency is related to but different from that of the signal at the system input terminal.

5. In a signal processing system of the type having 1. a system input terminal for receiving the signal to be processed,
2. a system output terminal at which the processed signal is provided,
3. a power amplifier having its output fed to the system output terminal,
4. means coupling the system input terminal to the input of the power amplifier,
5. control means for controlling the amplitude of the output of the power amplifier,
6. a differential amplifier having its output connected to the control means and emitting an error signal thereto in response to the input signals applied to the differential amplifier,
7. means providing a first signal path connecting the system input terminal to a first input of the differential amplifier,
8. means for sensing the output of the power amplifier and providing an electrical signal related thereto, and
9. means providing a second signal path connecting the output sensing means to a second input of the differential amplifier, the improvement wherein the means coupling the system input terminal to the input power amplifier includes a variable phase shifter and wherein the signal processing system further includes 10. means for controlling the variable phase shifter
11. a phase detector,
12. means for coupling the system input terminal and the system output terminal to different inputs of the phase detector, and
13. the phase detector emitting a signal to the means for controlling the variable phase shifter which determines the amount by which the input signal to the power amplifier is shifted in phase.

6. In a linear power amplifying system comprising 1. a system input terminal for receiving the signal to be linearly amplified,
2. a system output terminal at which the linearly amplified signal is provided,
3. a power amplifier having its input connected to the system input terminal and having its output connected to the system output terminal,
4. a first signal path having its input connected to the system input terminal, the first signal path having in it a first amplitude detector,
5. a second signal path having its input connected to the output of the power amplifier, said second signal path having in it a second amplitude detector and an attenuator,
6. a differential amplifier having its inputs fed by the outputs of the first and second signal paths,
7. and control means responsive to the output of the differential amplifier, the control means governing the amplitude of the output signal of the power amplifier in response to the output of the differential amplifier, the improvement wherein a. the attenuator is connected between the output of the power amplifier and the input of the second amplitude detector whereby both the first and second amplitude detectors operate with input signals that are substantially of the same amplitude, and b. the first and second amplitude detectors have substantially matched transfer characteristics over the range of signal amplitudes applied to their inputs.

7. The improvement in a linear power amplifying system according to claim 6, wherein the control means comprises apparatus which controls the a.c. cycle duty ratio of at least one stage of the power amplifier.

8. The improvement in a linear power amplifying system according to claim 7, wherein the apparatus which controls the a.c. cycle duty ratio causes the centroids of the individual a.c. cycles appearing at the system output terminal to be delayed a constant time from the centroids of the individual a.c. cycles appearing at the system imp ut terminal.

9. The improvement in a linear power amplifying system according to claim 6 wherein the control means includes a. means providing a d.c. supply voltage to one or more stages of the power amplifier, and b. a switching regulator comprising i. a switch governing the application of the d.c. voltage to those at least one stage, ii. and a modulator which responds to the output of the differential amplifier by controlling the operation of the switch.

10. In a linear power amplifying system comprising 1. a system input terminal for receiving the signal to be linearly amplified,
2. a system output terminal at which the linearly amplified signal is provided,
3. a power amplifier having its input connected to the system input terminal and having its output connected to the system output terminal,
4. comparison means for providing an error signal indicative of the difference between the amplitude of the signal at the system input terminal and the arithmetic product of the amplitude of the signal at the system output terminal and a constant factor, and
5. control means responsive to the error signal emitted by the comparison means, the control means governing the amplitude of the output of the power amplifier in accordance with the error signal, the improvement wherein the control means comprises a. means providing a d.c. supply voltage to at least one stage of the power amplifier, and b. a dissipative direct-coupled regulator disposed in the d.c. supply voltage path to those stages of the power amplifier, the output of the regulator being governed by the error signal from the comparison means.

11. The improvement in a linear power amplifying system according to claim 10 wherein the control means includes a switching regulator comprising c. a switch connected in the d.c. supply voltage path to the at least one stage of the power amplifier, the switch controlling the application of the d.c. supply voltage to those stages, and d. a modulator governing and operation of the switch in response to the error signal emitted by the comparison means.

12. In a linear power amplifying system comprising 1. a system input terminal for receiving the signal to be linearly amplified,
2. a system output terminal at which the linearly amplified signal is provided,
3. a power amplifier having its input connected to the system input terminal and having its output connected to the system output terminal,
4. comparison means for providing an error signal indicative of the difference between the amplitude of the signal at the system input terminal and the arithmetic product of the amplitude of the signal at the system output terminal and a constant factor, and
5. control means responsive to the error signal of the comparison means, the control means governing the amplitude of the power amplifier's output in accordance with the error signal, the improvement wherein the control means comprises a. means providing a d.c. supply voltage to at least one stage of the power amplifier, b. an a.c.-coupled modulator disposed in the path from the d.c. voltage supply means to those stages of the power amplifier, the a.c.-coupled modulator being responsive to the error signal of the comparison means, c. a switch connected in the path from the d.c. voltage supply means to those stages of the power amplifier, the switch governing the application of the d.c. supply voltage to the one or more stages, and d. a modulator governing the operation of the switch, the modulator responding to the error signal by controlling the duty cycle at which the switch operates.

13. In a linear power amplifying system comprising 1. a system input terminal for receiving the signal to be linearly amplified,
2. a system output terminal at which the linearly amplified signal is provided,
3. a power amplifier having its input connected to the system input terminal and having its output connected to the system output terminal,
4. comparison means for providing an error signal indicative of the difference between the amplitude of the signal at the system input terminal and the arithmetic product of the amplitude of the signal at the system output terminal and a constant factor, and
5. control means responsive to the error signal emitted by the comparison means, the control means governing the amplitude of the output of the power amplifier in accordance with the error signal, the improvement wherein the control means comprises apparatus which controls the a.c. cycle duty ratio of at least one stage of the power amplifier.

14. The improvement in a linear power amplifying system according to claim 13, wherein the apparatus which controls the a.c. cycle duty ratio causes the centroids of the individual a.c. cycles appearing at the system output terminal to be delayed a constant time from the centroids of the individual a.c. cycles appearing at the system input terminal.

15. A linear power amplifying system comprising a. a system input terminal for receiving the signal to be linearly amplified, b. a system output terminal at which the linearly amplified signal is provided, c. a power amplifier having its input connected to the system input terminal and having its output connected to the system output terminal, d. means for linearly combining the signals at the which are present at system input and output terminals, e. detection means fed by the output of the linear combining means, the output of the detection means being indicative of the difference between the amplitude of the signal at the system input terminal and the arithmetic product of the amplitude of the signal at the system output terminal and a constant factor, and f. control means responsive to the output of the detection means, the control means governing the amplitude of the output of the power amplifier in accordance with the output of the detection means.

16. The linear power amplifying system according to claim 15, wherein the detection means comprises a synchronous detector having as its analog signal input the output of the linear combining means and having as its reference phase input a signal of the same frequency as the signal at the system input terminal, and further comprising g. phase control means for controlling the relative phases of the signals applied to the linear combining means.

17. The linear power amplifying system according to claim 16, wherein the power amplifier includes a variable phase shifter, and wherein the phase control means comprises 1. means for controlling the variable phase shifter,
2. a phase detector having a different one of its inputs coupled to the system input terminal and to the system output terminal, the phase detector emitting a signal to the means for controlling the variable phase shifter which governs the amount by which the output signal of the variable phase shifter is shifted in phase with respect to the input thereof.

18. The linear power amplifying system according to claim 15, wherein the constant factor in the aforesaid arithmetic product is substantially independent of the relative phase of the signals at the system's input and output terminals.

19. The linear power amplifying system according to claim 18, wherein the linear combining means has two or more sections, each of which has means for linearly combining the signals applied to it, and wherein the detection means has two or more sections, each of which has means for detecting signals applied to it, and the detection means further comprises means for combining the outputs of the sections to provide the output of the detection means whereby the detection means yields an output that is substantially independent of the relative phase of the signals at the system's input and output terminals.

20. The linear power amplifying system according to claim 19, wherein a first section of the detection means comprises a synchronous detector, the synchronous detector having as its reference phase input a signal whose fundamental frequency component is a linear combination of the signals at the system input and output terminals, and the synchronous detector having as its analog signal input the output of a first section of the linear combining means, and wherein another of the sections of the detection means is associated with a different section of the linear combining means, the combination thereof performing a function substantially equivalent to the function performed by the combination of the aforesaid first sections where one of the input signals to the latter combination is shifted 180° in phase.

* * * * *

UNITED STATES PATENT OFFICE
CERTIFICATE OF CORRECTION

Patent No. 3,900,823 Dated August 19, 1975

Inventor(s) Nathan O. Sokal; Alan D. Sokal

It is certified that error appears in the above-identified patent and that said Letters Patent are hereby corrected as shown below:

Column 2, line 52, change "mdulation" to --modulation--

Column 2, line 24, change "comprising" to --compromising--

Column 26, line 32 to 33, change "instaneous" to --instantaneous--

Column 29, lines 23 to 24, change "one or more stages" to --at least one stage--

Column 29, line 27, change "at least one stage" to --stages--

Column 29, line 65, change "governing and" to --governing the--

Column 30, line 30, change "the one or more" to --those--

Column 31, line 6, delete "at the"

Column 31, line 7, before "system" insert --the--

Signed and Sealed this

*twenty-seventh* Day of *January 1976*

[SEAL]

*Attest:*

RUTH C. MASON
*Attesting Officer*

C. MARSHALL DANN
*Commissioner of Patents and Trademarks*

UNITED STATES PATENT OFFICE
CERTIFICATE OF CORRECTION

Patent No. 3,900,823 Dated August 19, 1975

Inventor(s) Nathan O. Sokal; Alan D. Sokal

It is certified that error appears in the above-identified patent and that said Letters Patent are hereby corrected as shown below:

Under "References Cited, United States Patents" change "Van Kesser et al." to --Van Kessel et al.--

In the Abstract, line 13, change "amplitude and" to --amplitude or--

In the Abstract, line 19, change "translator and phase shifter" to --translator or phase shifter or both--

Column 5, line 45, change "attenuator 13" to --attenuator 3--

Column 9, line 23, place a comma after "27"

Column 9, line 24, place a comma after "inputs"

Column 14, line 46, after "ematically" insert --representing--

Column 28, line 28, change "input power amplifier" to --input of the power amplifier--

Signed and Sealed this

Eighth Day of February 1977

[SEAL]

*Attest:*

RUTH C. MASON
*Attesting Officer*

C. MARSHALL DANN
*Commissioner of Patents and Trademarks*